United States Patent
Chen et al.

(10) Patent No.: US 11,430,865 B2
(45) Date of Patent: Aug. 30, 2022

(54) SEMICONDUCTOR DEVICE AND METHOD

(71) Applicant: Taiwan Semiconductor Manufacturing Company, Ltd., Hsinchu (TW)

(72) Inventors: Shu-Han Chen, Hsinchu (TW); Tsung-Ju Chen, Hsinchu (TW); Chun-Heng Chen, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/881,916

(22) Filed: May 22, 2020

(65) Prior Publication Data

US 2021/0233997 A1 Jul. 29, 2021

Related U.S. Application Data

(60) Provisional application No. 62/967,237, filed on Jan. 29, 2020.

(51) Int. Cl.
*H01L 29/06* (2006.01)
*H01L 29/66* (2006.01)
(Continued)

(52) U.S. Cl.
CPC ...... *H01L 29/0673* (2013.01); *H01L 21/0262* (2013.01); *H01L 21/30604* (2013.01); *H01L 21/31116* (2013.01); *H01L 21/31155* (2013.01); *H01L 29/66545* (2013.01); *H01L 29/66795* (2013.01); *H01L 29/785* (2013.01); *H01L 21/26513* (2013.01); *H01L 29/1083* (2013.01)

(58) Field of Classification Search
CPC .......... H01L 29/0673; H01L 29/66545; H01L 21/31155; H01L 21/30604; H01L 21/31116; H01L 29/785; H01L 29/66795; H01L 21/0262; H01L 21/26513; H01L 29/1083; H01L 29/42392; H01L 29/78696; H01L 21/32137; H01L 21/823828; H01L 21/823807; H01L 21/823864
USPC ....................................................... 257/401
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |

(Continued)

FOREIGN PATENT DOCUMENTS

| | | |
|---|---|---|
| KR | 100355035 B1 | 10/2002 |
| KR | 20030033672 A | 5/2003 |

(Continued)

*Primary Examiner* — Mohammad M Hoque
(74) *Attorney, Agent, or Firm* — Slater Matsil, LLP

(57) ABSTRACT

In an embodiment, a structure includes: a nano-structure; an epitaxial source/drain region adjacent the nano-structure; a gate dielectric wrapped around the nano-structure; a gate electrode over the gate dielectric, the gate electrode having an upper portion and a lower portion, a first width of the upper portion increasing continually in a first direction extending away from a top surface of the nano-structure, a second width of the lower portion being constant along the first direction; and a gate spacer between the gate dielectric and the epitaxial source/drain region.

20 Claims, 37 Drawing Sheets

(51) Int. Cl.
  *H01L 21/3115* (2006.01)
  *H01L 21/306* (2006.01)
  *H01L 21/311* (2006.01)
  *H01L 29/78* (2006.01)
  *H01L 21/02* (2006.01)
  *H01L 21/265* (2006.01)
  *H01L 29/10* (2006.01)

(56) References Cited

U.S. PATENT DOCUMENTS

| | | | |
|---|---|---|---|
| 8,826,213 | B1 | 9/2014 | Ho et al. |
| 8,887,106 | B2 | 11/2014 | Ho et al. |
| 9,660,028 | B1* | 5/2017 | Cheng ............. H01L 21/823412 |
| 10,043,879 | B1 | 8/2018 | Kim et al. |
| 2002/0142523 | A1 | 10/2002 | Ryu et al. |
| 2005/0272231 | A1 | 12/2005 | Yun et al. |
| 2011/0073963 | A1 | 3/2011 | Beyer et al. |
| 2011/0079854 | A1 | 4/2011 | Lin |
| 2012/0088359 | A1 | 4/2012 | Kim et al. |
| 2012/0322218 | A1 | 12/2012 | Lai et al. |
| 2014/0080276 | A1 | 3/2014 | Brand et al. |
| 2014/0231885 | A1 | 8/2014 | Xie et al. |
| 2014/0282326 | A1 | 9/2014 | Chen et al. |
| 2015/0255542 | A1 | 9/2015 | Cai et al. |
| 2016/0049488 | A1 | 2/2016 | Shen et al. |
| 2016/0240624 | A1 | 8/2016 | Zhu |
| 2016/0343827 | A1 | 11/2016 | Wu et al. |
| 2016/0365449 | A1 | 12/2016 | Chang et al. |
| 2017/0005005 | A1 | 1/2017 | Chen et al. |
| 2017/0186623 | A1* | 6/2017 | Posseme ............. H01L 21/2236 |
| 2018/0069103 | A1 | 3/2018 | Chui et al. |
| 2018/0151699 | A1* | 5/2018 | Lu ...................... H01L 21/0228 |
| 2018/0174846 | A1 | 6/2018 | Wang et al. |
| 2018/0182856 | A1 | 6/2018 | Lee |
| 2019/0013400 | A1 | 1/2019 | Lee et al. |
| 2019/0051730 | A1 | 2/2019 | Min |
| 2020/0251573 | A1* | 8/2020 | Jeong ............... H01L 21/32134 |
| 2021/0035857 | A1 | 2/2021 | Zhou |
| 2021/0074829 | A1 | 3/2021 | Tang et al. |

FOREIGN PATENT DOCUMENTS

| | | |
|---|---|---|
| KR | 20050116707 A | 12/2005 |
| KR | 20170004827 A | 1/2017 |
| KR | 20180027335 A | 3/2018 |
| KR | 20180073223 A | 7/2018 |
| KR | 20180103402 A | 9/2018 |
| KR | 20180118027 A | 10/2018 |

* cited by examiner

SEMICONDUCTOR DEVICE AND METHOD

PRIORITY CLAIM AND CROSS-REFERENCE

This application claims the benefit of U.S. Provisional Application No. 62/967,237, filed on Jan. 29, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
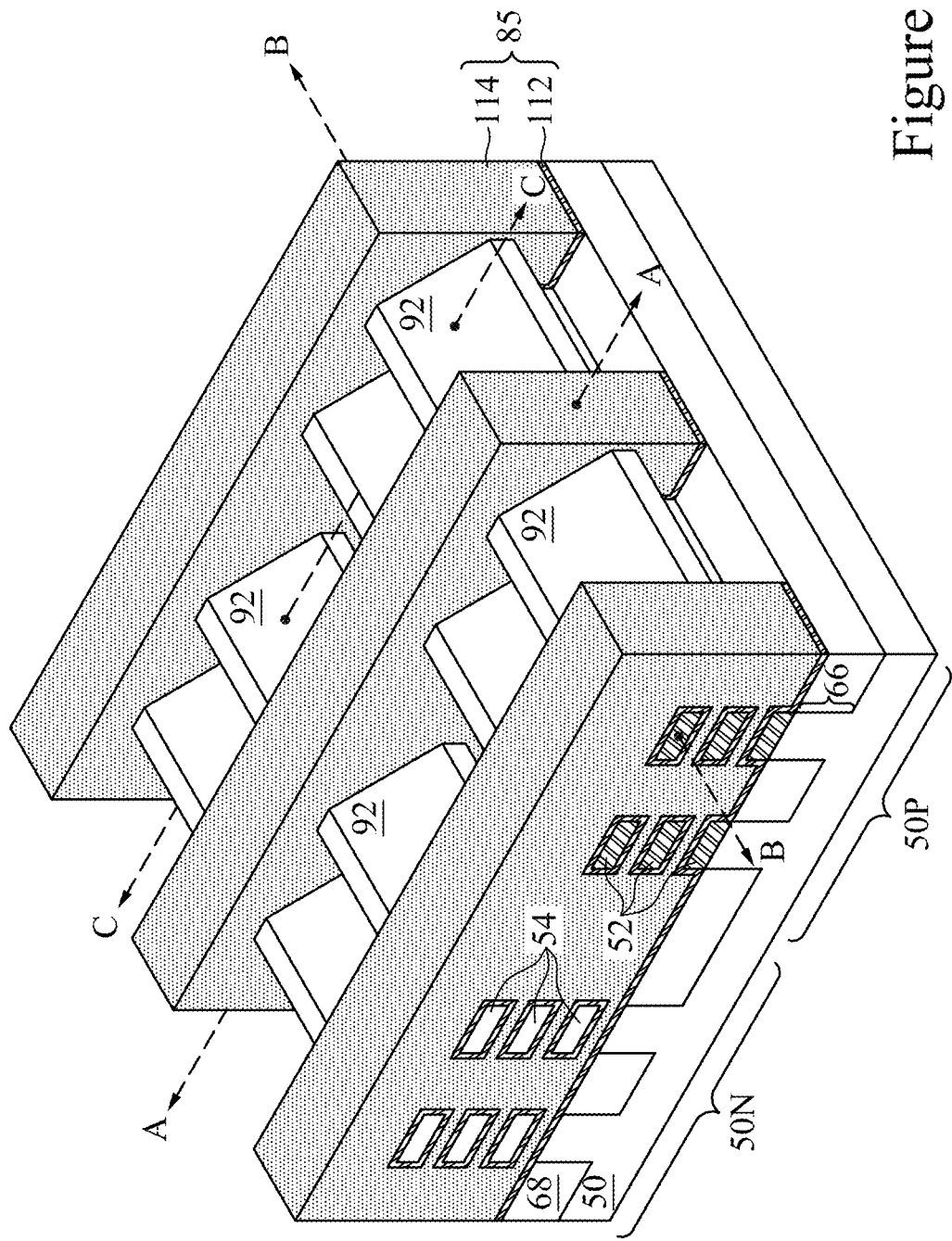
FIG. 1 illustrates an example of a nano-structure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, funnel-shaped gate electrodes are formed in a gate replacement process for nano-FETs. During the gate replacement process, recesses for the replacement gates can be widened to have funnel shapes. The recesses can be widened by implanting an impurity in upper regions of the gate spacers for the nano-FETs, and then removing the upper regions of the gate spacers with an etch that is selective to the impurity. Widening the recesses to have funnel shapes can help avoid the formation of seams (or voids) when filling the replacement gates.

FIG. 1 illustrates an example of simplified nano-FETs in a three-dimensional view, in accordance with some embodiments. Some features of the nano-FETs (discussed below) are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nano-structures 55 over fins 66 extending from a substrate 50, where the nano-structures 55 act as channel regions for the nano-FETs. Shallow trench isolation (STI) regions 68 are disposed over the substrate 50 and between adjacent ones of the fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may include a single material or a plurality of materials. In this context, the fins 66 refer to the portion extending between the neighboring STI regions 68.

Gate structures 85 are wrapped around the nano-structures 55 (e.g., the channel regions for the nano-FETs). The gate structures 85 include gate dielectrics 112 and gate electrodes 114. The gate dielectrics 112 are along top surfaces, sidewalls, and bottom surfaces of the nano-structures 55 and may extend along sidewalls and over top surfaces of the fins 66. The gate electrodes 114 are over the gate dielectrics 112. Epitaxial source/drain regions 92 are disposed on opposite sides of the nano-structures 55 with respect to the gate structures 85. In embodiments where multiple transistors are formed, the epitaxial source/drain regions 92 may be shared between various transistors. In embodiments where one transistor is formed from multiple nano-structures 55, neighboring epitaxial source/drain regions 92 may be electrically coupled, such as through coalescing the epitaxial source/drain regions 92 by epitaxial growth, or through coupling the epitaxial source/drain regions 92 with a same source/drain contact. One or more inter-layer dielectric (ILD) layer(s) (discussed below) are over the epitaxial source/drain regions 92 and/or the gate electrodes 114, through which contacts (discussed below) to the epitaxial source/drain regions 92 and the gate electrodes 114 are formed.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs).

FIG. 1 further illustrates reference cross-sections that are used in later figures. Cross-section A-A is along a longitudinal axis of a gate electrode 114 and in a direction, for example, perpendicular to the direction of current flow between the epitaxial source/drain regions 92 of a nano-FET. Cross-section B-B is perpendicular to cross-section A-A and is along a longitudinal axis of a fin 66 and in a direction of, for example, a current flow between the epitaxial source/drain regions 92 of the nano-FET. Cross-section C-C is parallel to cross-section A-A and extends through epitaxial source/drain regions 92 of the nano-FETs. Subsequent figures refer to these reference cross-sections for clarity.

FIGS. 2 through 6 are three-dimensional views of intermediate stages in the manufacturing of nano-FETs, in accordance with some embodiments. FIGS. 2 through 6 show a similar three-dimensional view as FIG. 1.

Figure 2:
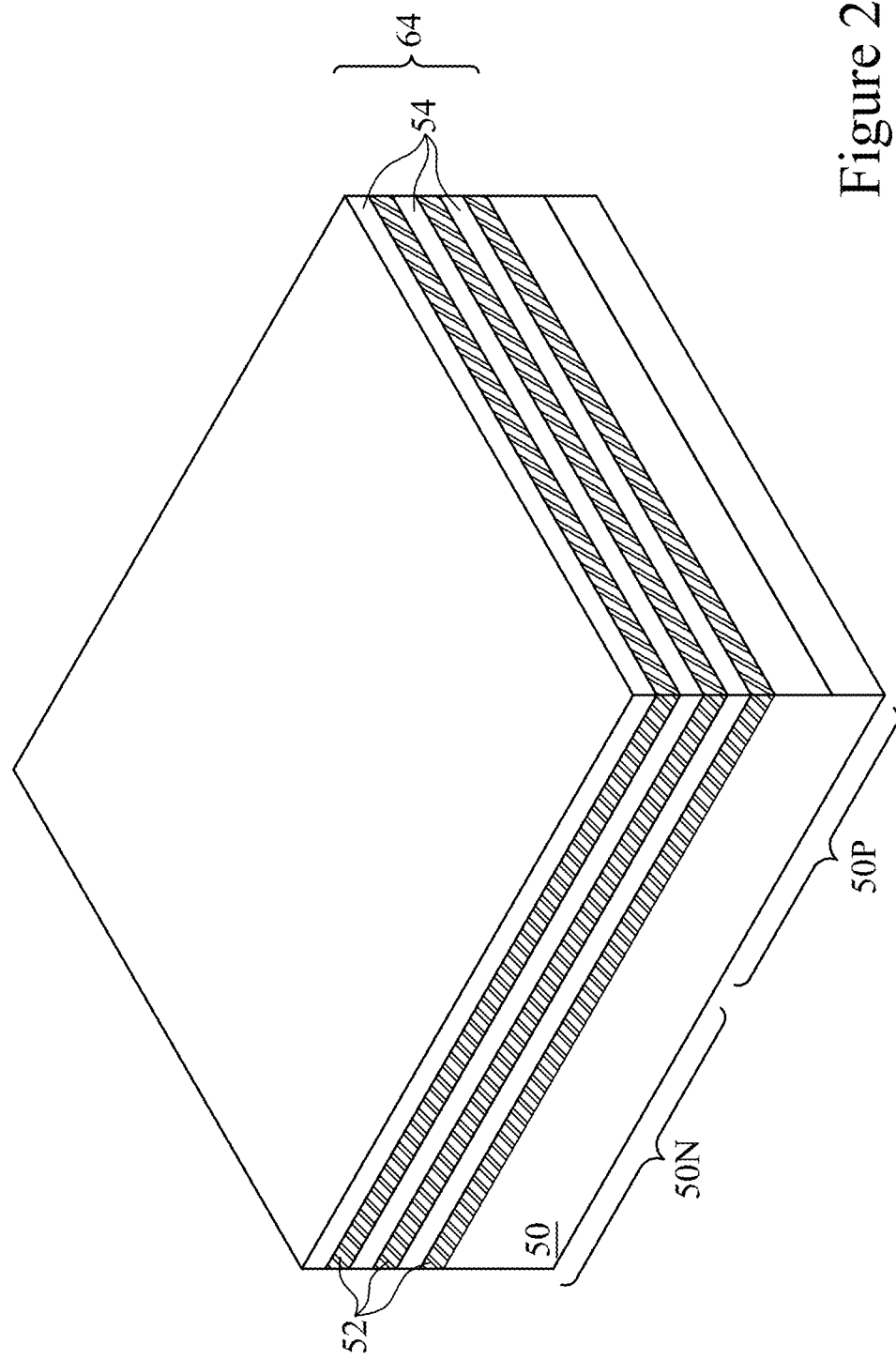
FIGS. 2 through 17B are various views of further intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, dopants may be implanted in the n-type region 50N and the p-type region 50P. The dopants may have a conductivity type opposite a conductivity type of source/drain regions to be formed in each of the n-type region 50N and the p-type region 50P. The APT region may extend under subsequently formed source/drain regions in the nano-FETs, which will be formed in subsequent processes. The APT region may be used to reduce the leakage from the source/drain regions to the substrate 50. In some embodiments, the doping concentration in the APT region may be in the range of about $10^{18}$ cm$^{-3}$ to about $10^{19}$ cm$^{-3}$.

A multi-layer stack 64 is formed over the substrate 50. The multi-layer stack 64 includes alternating layers of first semiconductor layers 52 and second semiconductor layers 54. As discussed further below, the second semiconductor layers 54 will be removed and the first semiconductor layers 52 will be patterned to form channel regions of nano-FETs in the p-type region 50P, and the first semiconductor layers 52 will be removed and the second semiconductor layers 54 will be patterned to form channel regions of nano-FETs in the n-type region 50N. In another embodiment, the first semiconductor layers 52 may be removed and the second semiconductor layers 54 may be patterned to form channel regions of nano-FETs in the p-type region 50P, and the second semiconductor layers 54 may be removed and the first semiconductor layers 52 may be patterned to form channel regions of nano-FETs in n-type region 50N.

The multi-layer stack 64 is illustrated as including three layers of each of the first semiconductor layers 52 and the second semiconductor layers 54 for illustrative purposes. It should be appreciated that the multi-layer stack 64 may include any number of the first semiconductor layers 52 and the second semiconductor layers 54. Each of the layers of the multi-layer stack 64 may be epitaxially grown using a process such as vapor phase epitaxy (VPE), molecular beam epitaxy (MBE), chemical vapor deposition (CVD), atomic layer deposition (ALD), or the like, and may be epitaxially grown to a thickness in a range of about 8 nm to about 10 nm. In various embodiments, the first semiconductor layers 52 may be formed of a first semiconductor material suitable for p-type nano-FETs, such as silicon germanium (e.g., $Si_xGe_{1-x}$, where x can be in the range of 0 to 1), pure or substantially pure germanium, a III-V compound semiconductor, a II-VI compound semiconductor, or the like, and the second semiconductor layers 54 may be formed of a second semiconductor material suitable for n-type nano-FETs, such as silicon, silicon carbide, a III-V compound semiconductor, a II-VI compound semiconductor, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor material and the second semiconductor material may be materials having a high etching selectivity to one another, relative a same etching process. As such, the first semiconductor layers 52 of the first semiconductor material may be removed without removing the second semiconductor layers 54 of the second semiconductor material in the n-type region 50N, and the second semiconductor layers 54 of the second semiconductor material may be removed without removing the first semiconductor layers 52 of the first semiconductor material in the p-type region 50P.

Figure 3:
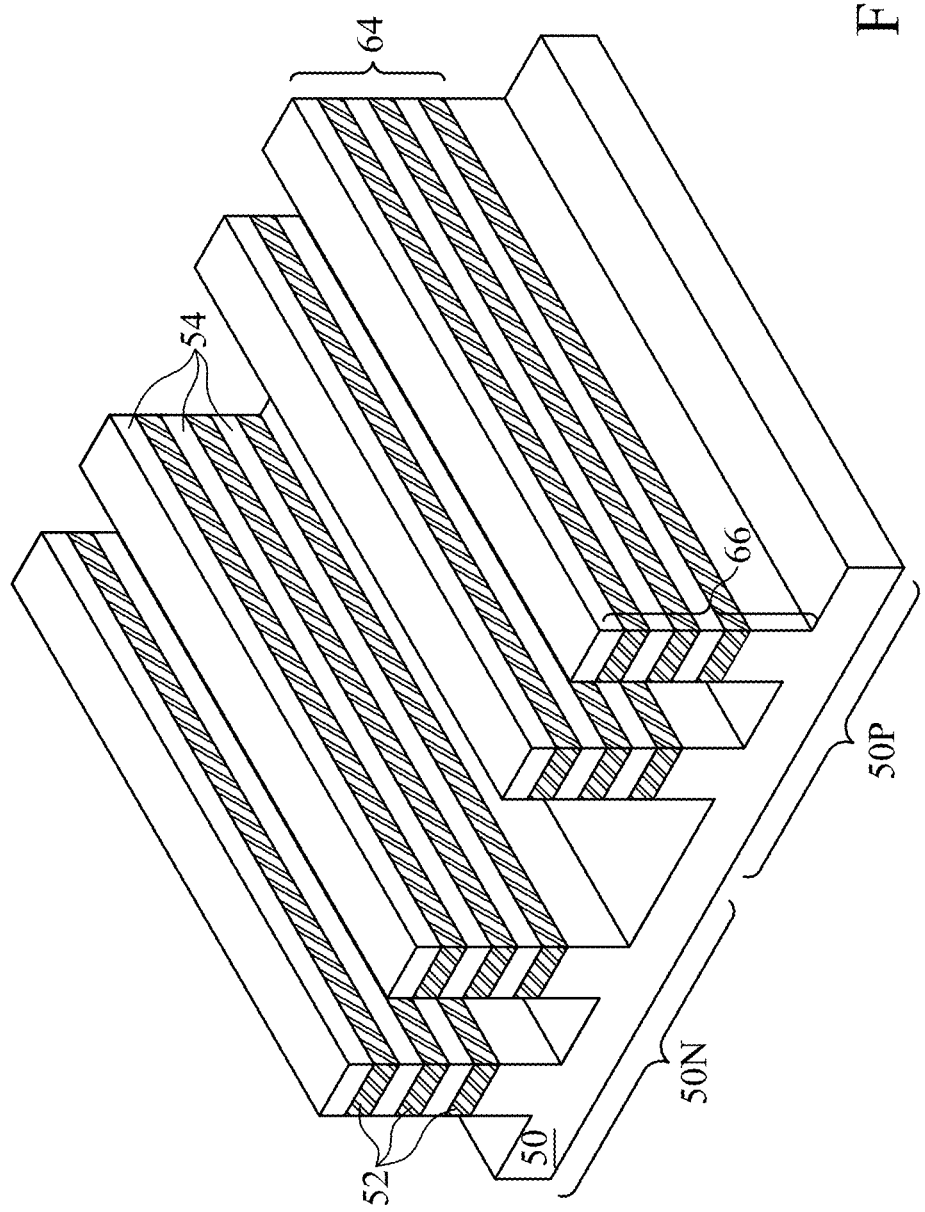

In FIG. 3, fins 66 are formed in the multi-layer stack 64 and the substrate 50. The fins 66 are semiconductor strips. In some embodiments, the fins 66 may be formed in the multi-layer stack 64 and the substrate 50 by etching trenches in the multi-layer stack 64 and the substrate 50. The etching may be any acceptable etch process, such as a reactive ion etch (RIE), neutral beam etch (NBE), the like, or a combination thereof. The etching may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The fins 66 may have widths in a range of about 8 nm to about 40 nm. The fins 66 in the n-type region 50N and the p-type region 50P are illustrated as having substantially equal widths for illustrative purposes. In some embodiments, the fins 66 in one region (e.g., the n-type region 50N) may be wider or narrower than the fins 66 in the other region (e.g., the p-type region 50P).

Figure 4:
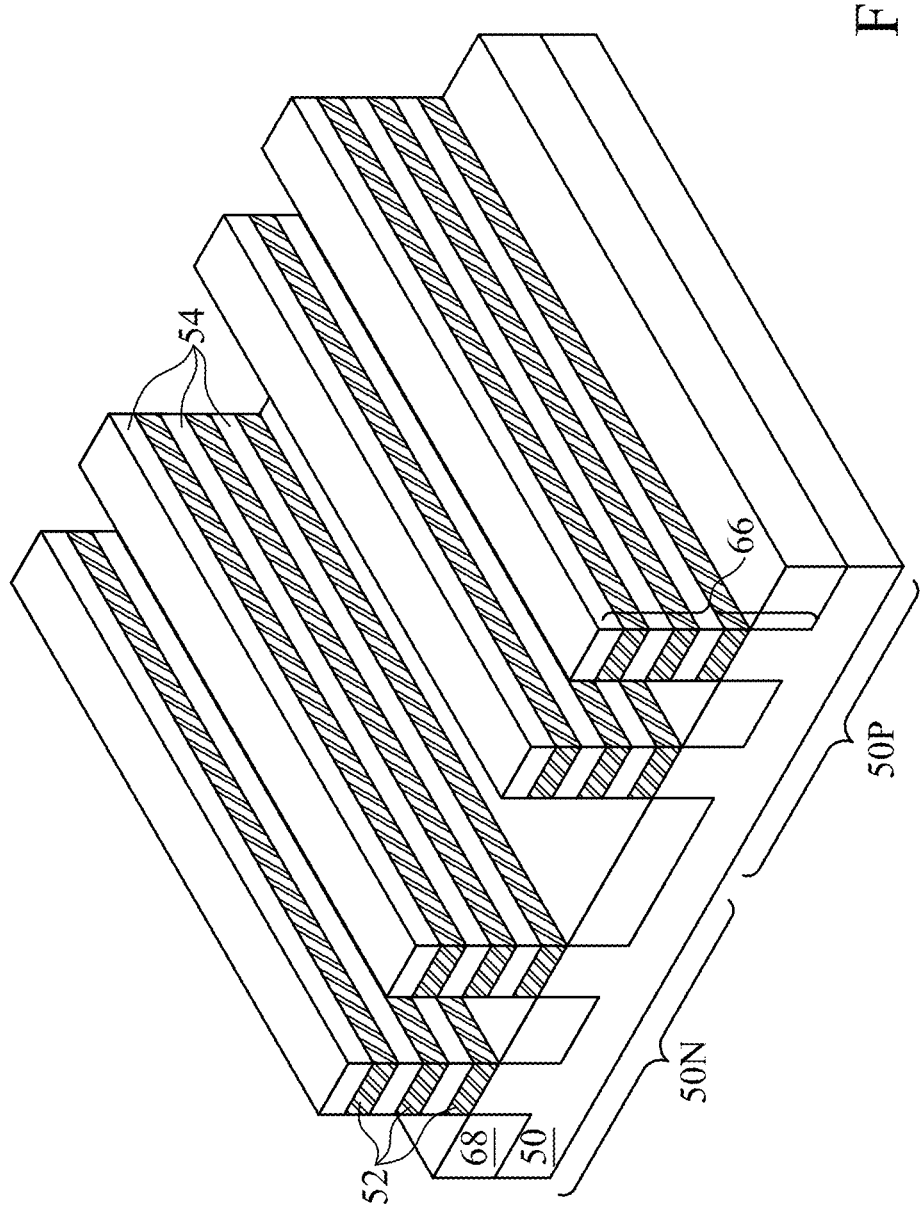

In FIG. 4, STI regions 68 are formed adjacent the fins 66. The STI regions 68 may be formed by depositing an insulation material over the substrate 50 and the fins 66 and between adjacent ones of the fins 66. The insulation material may be an oxide such as silicon oxide, a nitride such as silicon nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the fins 66. Although the insulation material is illustrated as a single layer, some embodiments may utilize multiple layers. For example, in some embodiments a liner may first be formed along a surface of the substrate 50 and the fins 66. Thereafter, a fill material, such as those discussed above may be formed over the liner.

A removal process is then applied to the insulation material to remove excess insulation material over the fins 66. In some embodiments, a planarization process such as a chemical mechanical polish (CMP), an etch-back process, combinations thereof, or the like may be utilized. The planarization process exposes the fins 66 such that top surfaces of the fins 66 and the insulation material are coplanar after the planarization process is complete.

The insulation material is then recessed to form the STI regions 68. The insulation material is recessed such that upper portions of fins 66 in the n-type region 50N and the p-type region 50P protrude from between neighboring STI regions 68. In the illustrated embodiment, the top surfaces of the STI regions 68 are coplanar with the top surfaces of the substrate 50. In some embodiments, the top surfaces of the STI regions 68 are above or below the top surfaces of the substrate 50. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66). For example, an oxide removal using, for example, dilute hydrofluoric (dHF) acid may be used.

The process described above is just one example of how the fins 66 may be formed. In some embodiments, the fins 66 may be formed by an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66. The epitaxial structures may include the alternating semiconductor materials discussed above, such as the first semiconductor materials and the second semiconductor materials. In embodiments where epitaxial structures are epitaxially grown, the epitaxially grown materials may be in situ doped during growth, which may obviate prior and/or subsequent implantations, although in situ and implantation doping may be used together.

Further, appropriate wells may be formed in the fins 66 and/or the substrate 50. In some embodiments, a p-type well may be formed in the n-type region 50N, and an n-type well may be formed in the p-type region 50P. In another embodiment, p-type wells or n-type wells may be formed in both the n-type region 50N and the p-type region 50P.

In embodiments with different well types, different implant steps for the n-type region 50N and the p-type region 50P may be achieved using a photoresist or other masks. For example, a photoresist may be formed over the fins 66 and the STI regions 68 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of about $10^{13}$ cm$^{-3}$ to about $10^{14}$ cm$^{-3}$. After the implant, the photoresist is removed, such as by an acceptable ashing process.

Following the implanting of the p-type region 50P, a photoresist is formed over the fins 66 and the STI regions 68 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of about $10^{13}$ cm$^{-3}$ to about $10^{14}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
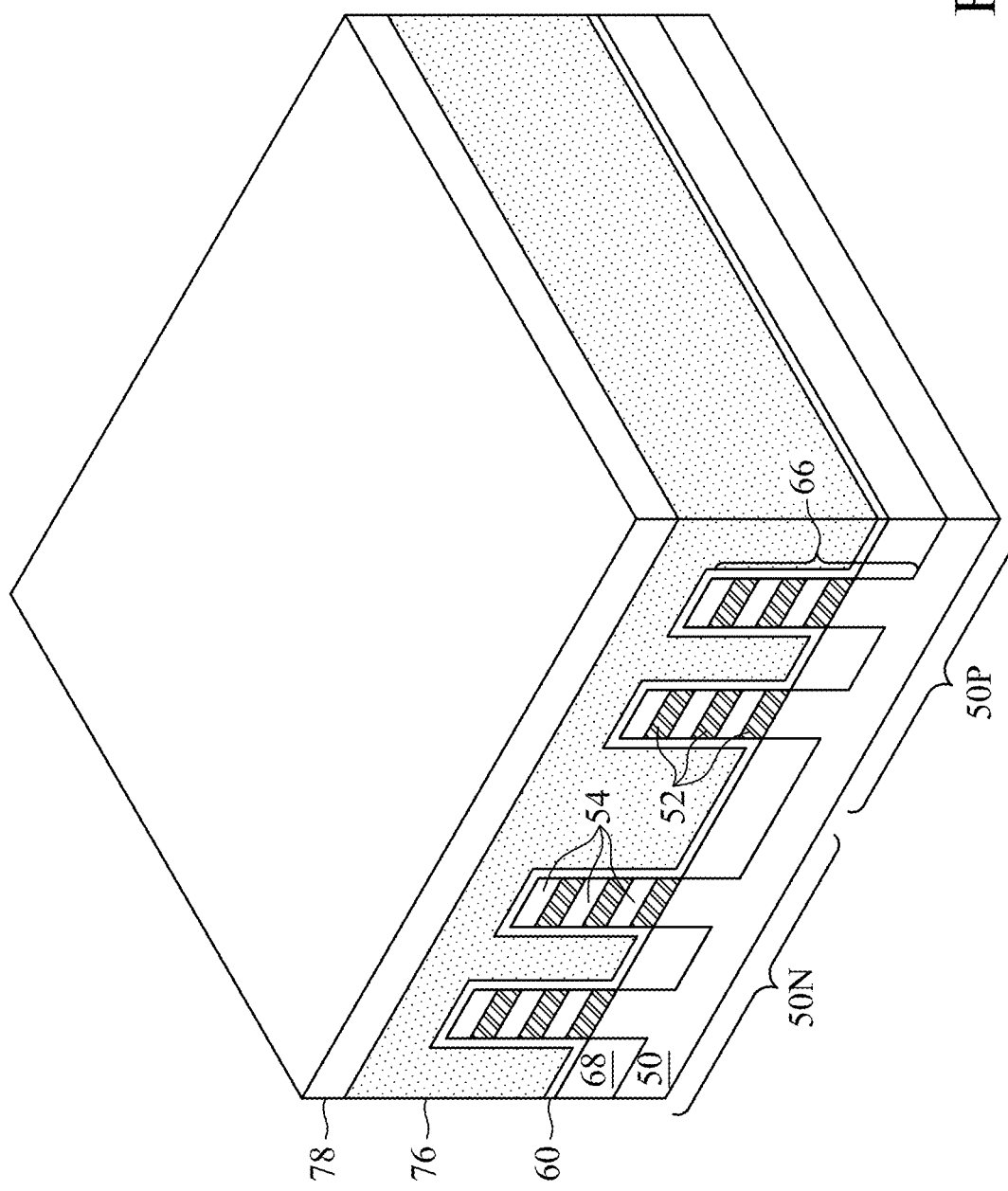

In FIG. 5, a dummy dielectric layer 70 is formed on the fins 66. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), polycrystalline silicon germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions, e.g., the STI regions 68 and/or the dummy dielectric layer 70. The mask layer 74 may include one or more layers of, for example, silicon nitride, silicon oxynitride, or the like. In this example, a single dummy gate layer 72 and a single mask layer 74 are formed across the n-type region 50N and the p-type region 50P. Although the dummy dielectric layer 70 is shown covering the STI regions 68, it should be appreciate that the dummy dielectric layer 70 can be formed in other manners. In some embodiments, such as when the dummy dielectric layer 70 is thermally grown, the dummy dielectric layer 70 is formed to only cover the fins 66.

Figure 6:
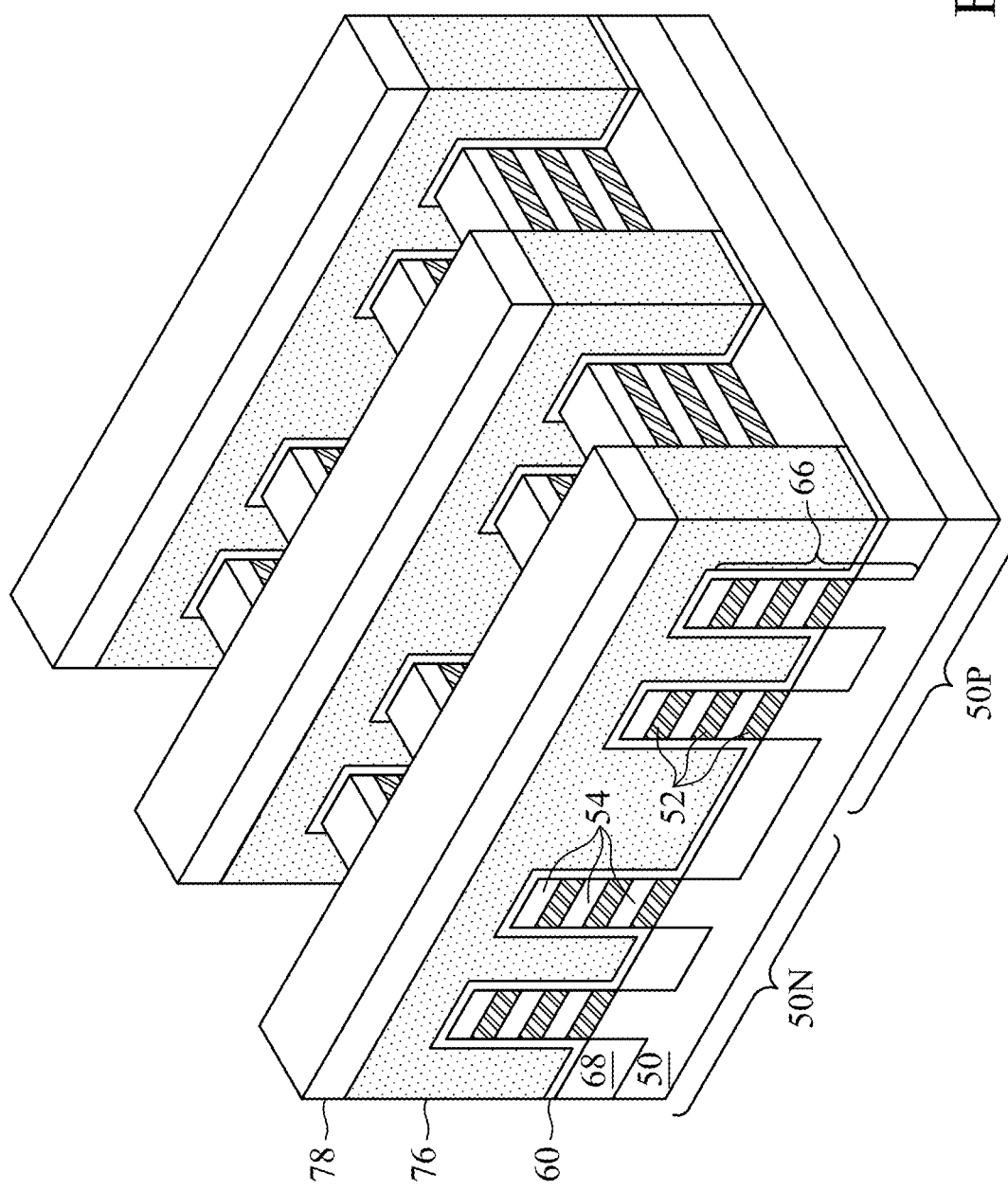

In FIG. 6, the mask layer 74 is patterned using acceptable photolithography and etching techniques to form masks 78. The pattern of the masks 78 is then transferred to the dummy gate layer 72 by an acceptable etching technique to form dummy gates 76. The pattern of the masks 78 may optionally be further transferred to the dummy dielectric layer 70 by an acceptable etching technique to form dummy dielectrics 60. The dummy gates 76 cover portions of the fins 66 that will be patterned in subsequent processing to form nano-structures, which will act as channel regions for the nano-FETs. The pattern of the masks 78 may be used to physically separate adjacent dummy gates 76. The dummy gates 76 may also have lengthwise directions substantially perpendicular (within process variations) to the lengthwise directions of the fins 66. The masks 78 can optionally be removed after patterning, such as by an acceptable etching technique.

FIGS. 7A through 17B are cross-sectional views of further intermediate stages in the manufacturing of nano-FETs, in accordance with some embodiments. FIGS. 7A, 8A, 9A, 10A, 11A, 12A, 13A, 14A, 16A, and 17A are illustrated along reference cross-section A-A in FIG. 1, and illustrate features in both the n-type region 50N and the p-type region 50P. FIGS. 7B, 8B, 9B, 10B, 11B, 12B, 13B, 14B, 16B, and 17B are illustrated along reference cross-section B-B in FIG. 1, and illustrate features in both the n-type region 50N and the p-type region 50P. FIGS. 11C and 11D are illustrated along reference cross-section C-C in FIG. 1, and illustrate features in both the n-type region 50N and the p-type region 50P.

Figure 7A:
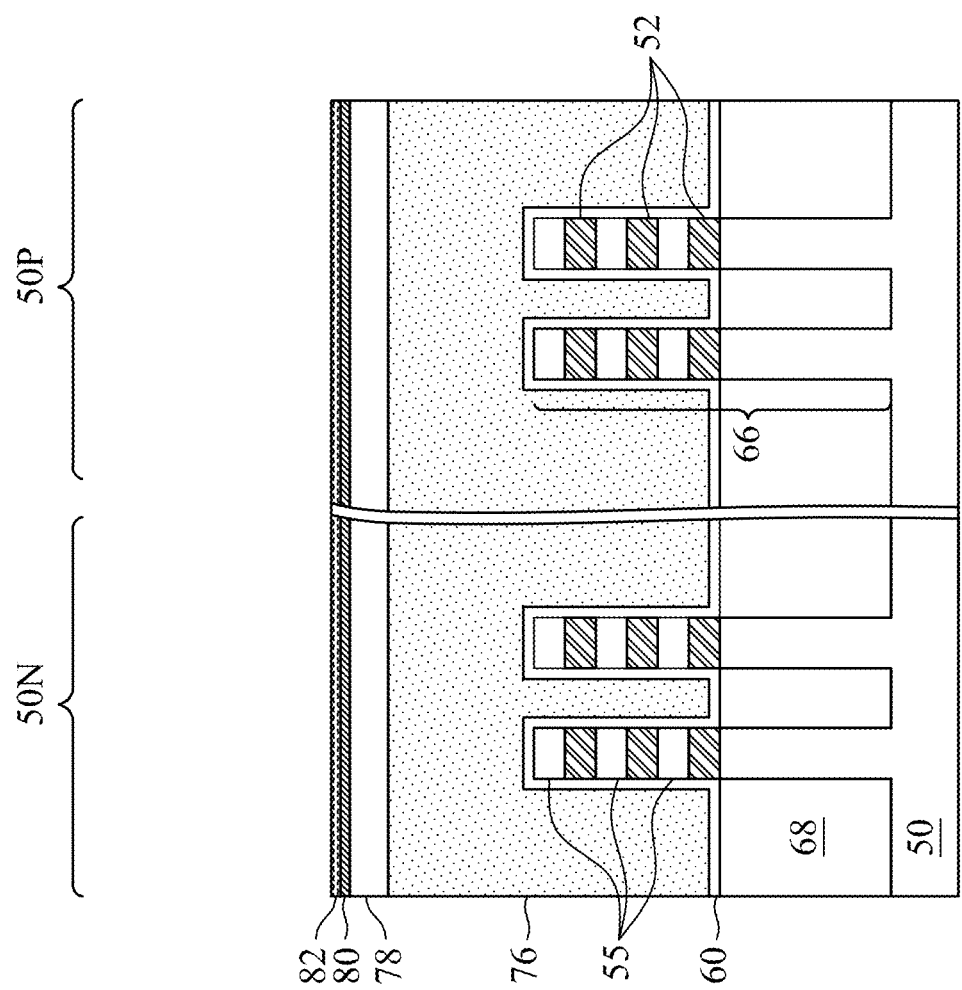
Figure 7B:
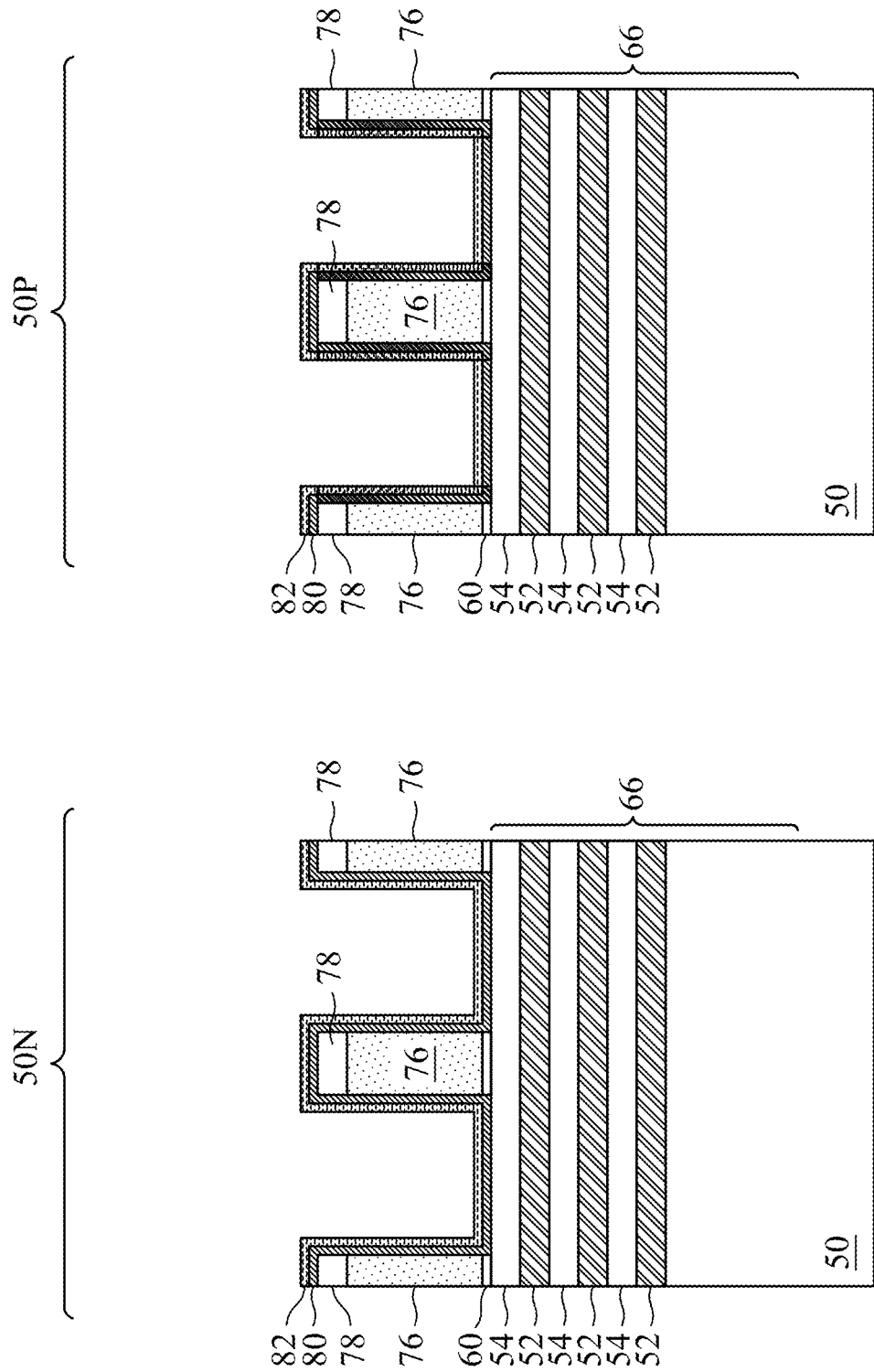

In FIGS. 7A and 7B, a first spacer layer 80 and a second spacer layer 82 are formed. The first spacer layer 80 is formed on top surfaces of the STI regions 68, top surfaces and sidewalls of the fins 66 and the masks 78 (if present), and sidewalls of the dummy gates 76 and the dummy dielectrics 60. The second spacer layer 82 is deposited over the first spacer layer 80. The first spacer layer 80 may be formed of silicon oxide, silicon nitride, silicon oxynitride, silicon oxycarbonitride, or the like. The first spacer layer 80 may be formed by thermal oxidation or deposited by CVD, ALD, or the like. The second spacer layer 82 may be formed of silicon oxide, silicon nitride, silicon oxynitride, silicon oxycarbonitride, or the like. The second spacer layer 82 may be deposited by CVD, ALD, or the like.

In some embodiments, the first spacer layer 80 and the second spacer layer 82 are each formed of silicon oxycarbonitride (e.g., $SiO_xN_yC_{1-x-y}$, where x and y are in the range of 0 to 1), and have different compositions of silicon oxycarbonitride. Specifically, the first spacer layer 80 can be composed of more nitrogen (by atomic percent) than the second spacer layer 82, and the second spacer layer 82 can be composed of more oxygen (by atomic percent) than the first spacer layer 80. Forming the first spacer layer 80 of nitrogen-rich silicon oxycarbonitride increases its etching selectivity with the dummy dielectrics 60, relative an etching process (discussed further below) that will be used to remove the dummy dielectrics 60. Forming the second spacer layer 82 of oxygen-rich silicon oxycarbonitride decreases the relative permittivity of the second spacer layer 82, allowing subsequently formed spacers to have greater electrical isolation.

In embodiments where the first spacer layer 80 and the second spacer layer 82 are each formed of silicon oxycarbonitride, the silicon oxycarbonitride layers can be deposited using dielectric material precursors including a silicon source precursor (e.g., hexachlorodisilane ($Si_2Cl_6$, HCD)), an oxygen source precursor (e.g., oxygen gas ($O_2$)), a carbon source precursor (e.g., propylene ($C_3H_6$)), and a nitrogen source precursor (e.g., ammonia ($NH_3$)). In embodiments where the deposition is by CVD, the composition(s) of the silicon oxycarbonitride layers can be controlled by controlling the flow rates of the source precursors during CVD. For example, the silicon source precursor can be dispensed at a rate in the range of about 100 sccm to about 1000 sccm, the oxygen source precursor can be dispensed at a rate in the range of about 1000 sccm to about 20000 sccm, the carbon source precursor can be dispensed at a rate in the range of about 1000 sccm to about 10000 sccm, and the nitrogen source precursor can be dispensed at a rate in the range of about 5000 sccm to about 30000 sccm.

Implants for lightly doped source/drain (LDD) regions may be performed after the first spacer layer 80 is formed, or after both the first spacer layer 80 and the second spacer layer 82 are formed. In embodiments with different device types, similar to the implants discussed above, a mask, such as a photoresist, may be formed over the n-type region 50N, while exposing the p-type region 50P, and appropriate type (e.g., p-type) impurities may be implanted into the fins 66 in the p-type region 50P. The mask may then be removed. Subsequently, a mask, such as a photoresist, may be formed over the p-type region 50P while exposing the n-type region 50N, and appropriate type impurities (e.g., n-type) may be implanted into the fins 66 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in the range of about $10^{15}$ cm$^{-3}$ to about $10^{19}$ cm$^{-3}$. An anneal may be used to repair implant damage and to activate the implanted impurities.

Figure 8A:
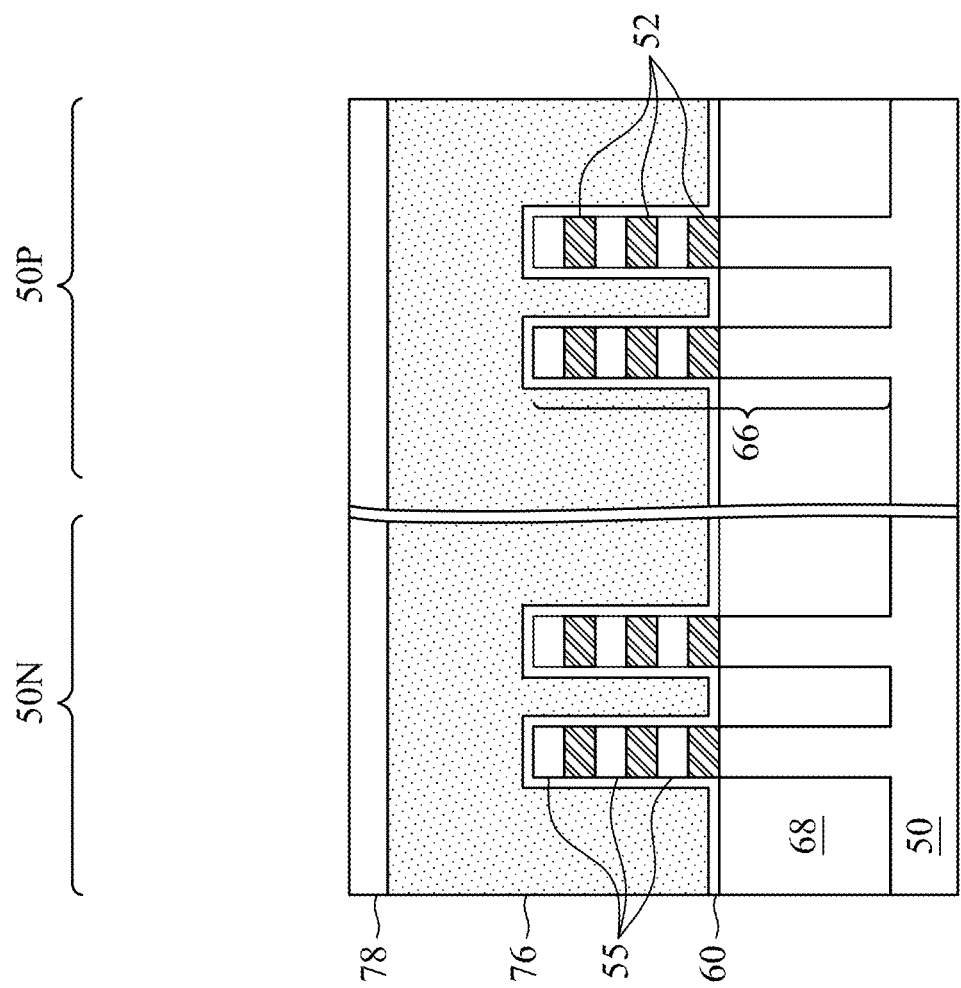
Figure 8B:
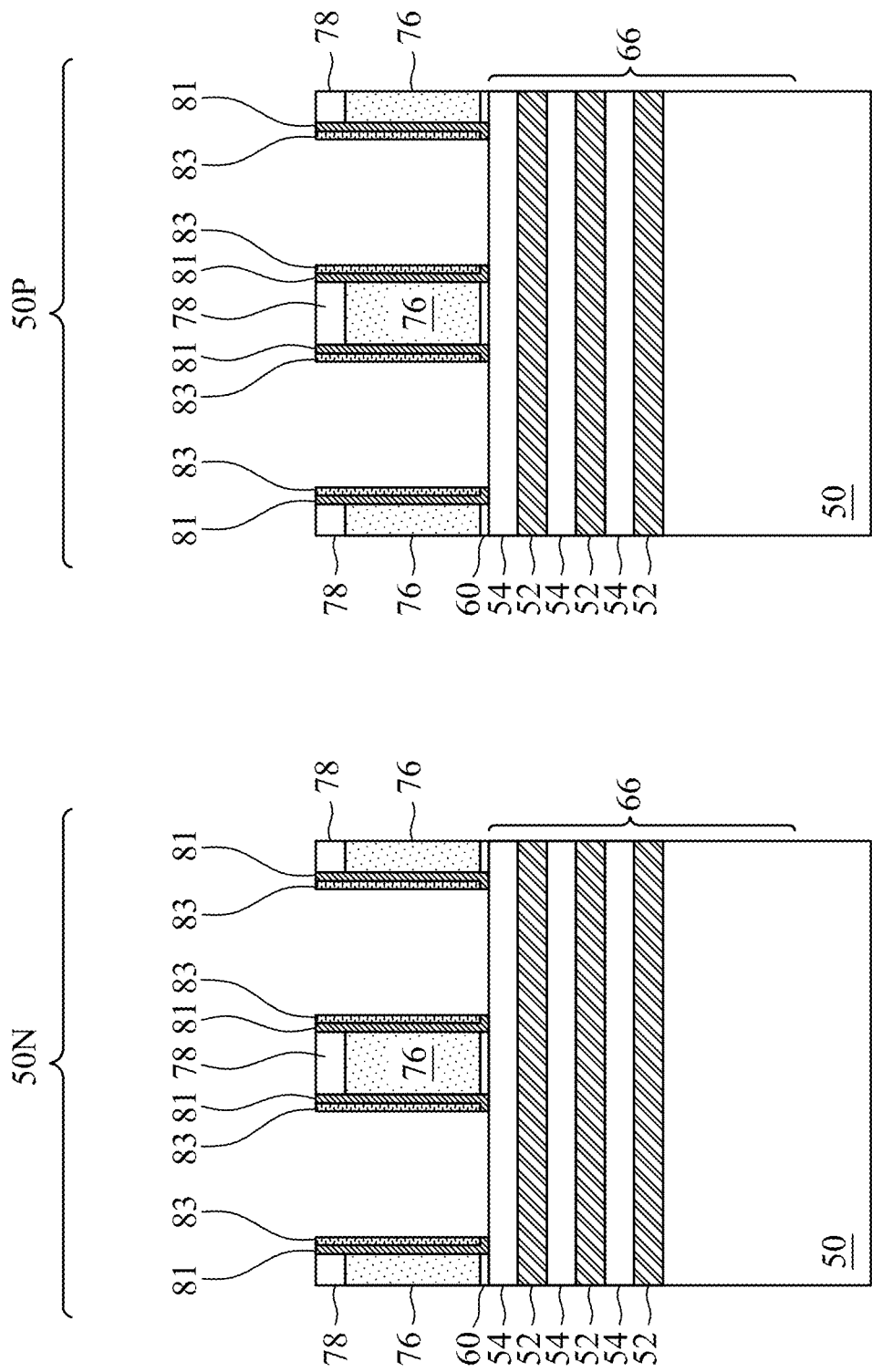

In FIGS. 8A and 8B, the first spacer layer 80 and the second spacer layer 82 are etched to form first spacers 81 and second spacers 83, respectively. The first spacer layer 80 and the second spacer layer 82 may each be etched using a suitable etching process, such as an isotropic etching process (e.g., a wet etching process), an anisotropic etching process (e.g., a dry etching process), or the like. In some embodiments, the materials of the first spacer layer 80 and the second spacer layer 82 have a high etching selectivity to one another, relative a same etching process, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process where the first spacer layer 80 acts as an etch stop layer, with remaining portions of the second spacer layer 82 forming the second spacers 83. Thereafter, the first spacer layer 80 may be etched using an isotropic etch process where the second spacers 83 act as an etching mask, with remaining portions of the first spacer layer 80 forming the first spacers 81.

In the illustrated embodiment, the first spacers 81 and the second spacers 83 are disposed on sidewalls of the fins 66, the dummy gates 76, and the masks 78 (if present). In another embodiment, the second spacer layer 82 may be removed from over the first spacer layer 80 adjacent the masks 78 (if present), the dummy gates 76, and/or the dummy dielectrics 60.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, etc.), and/or the like. Furthermore, the n-type and p-type devices may be formed using a different structures and steps.

Figure 9A:
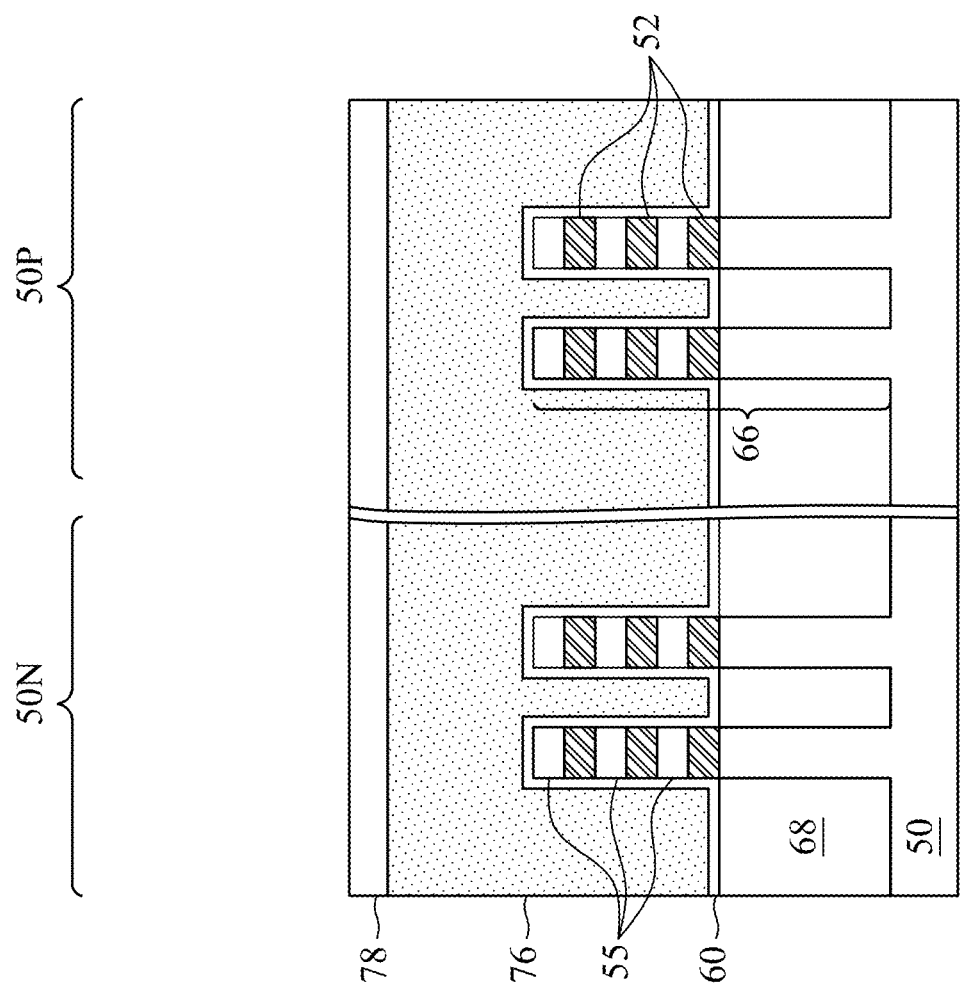
Figure 9B:
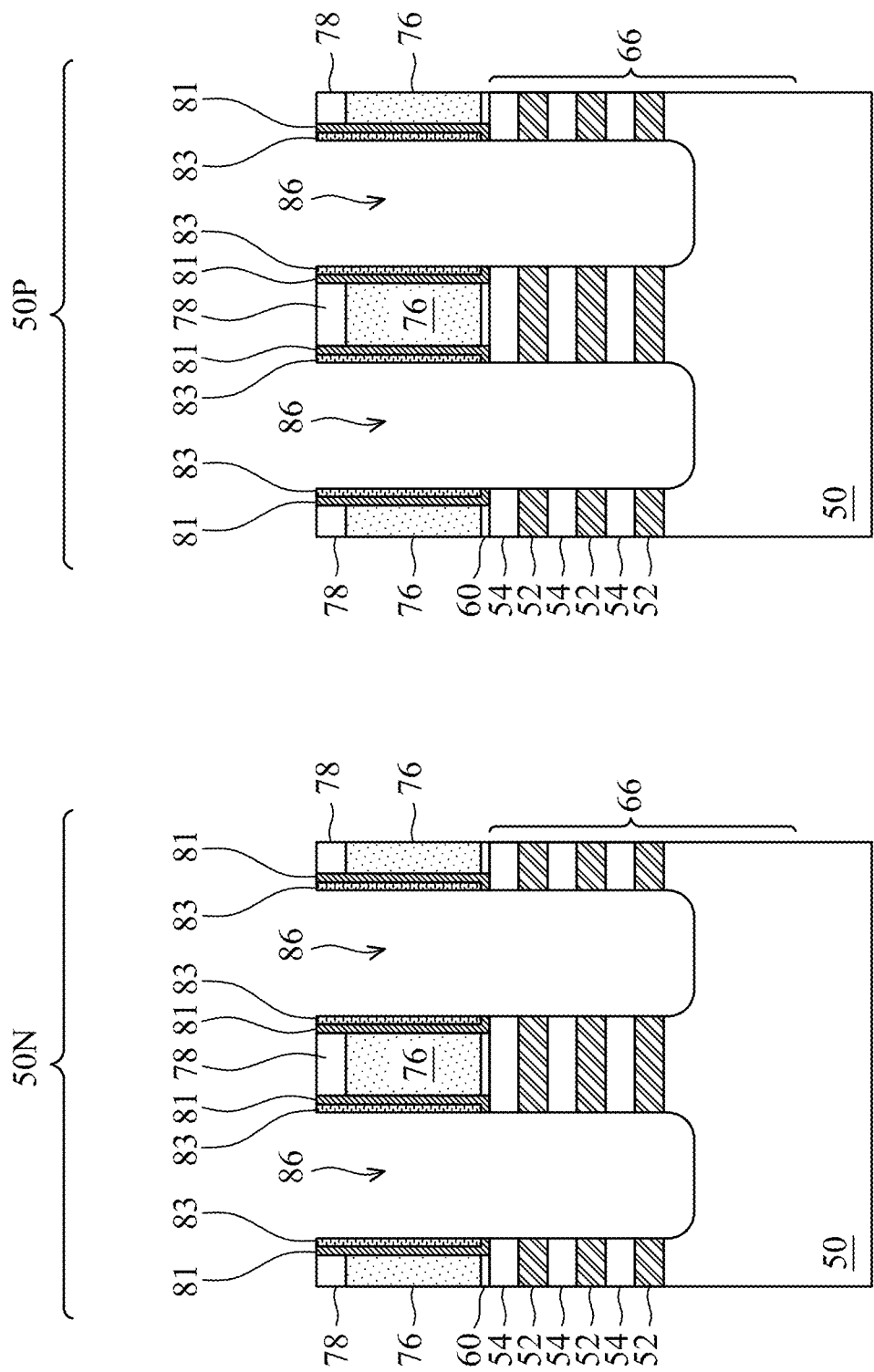
Figure 10A:
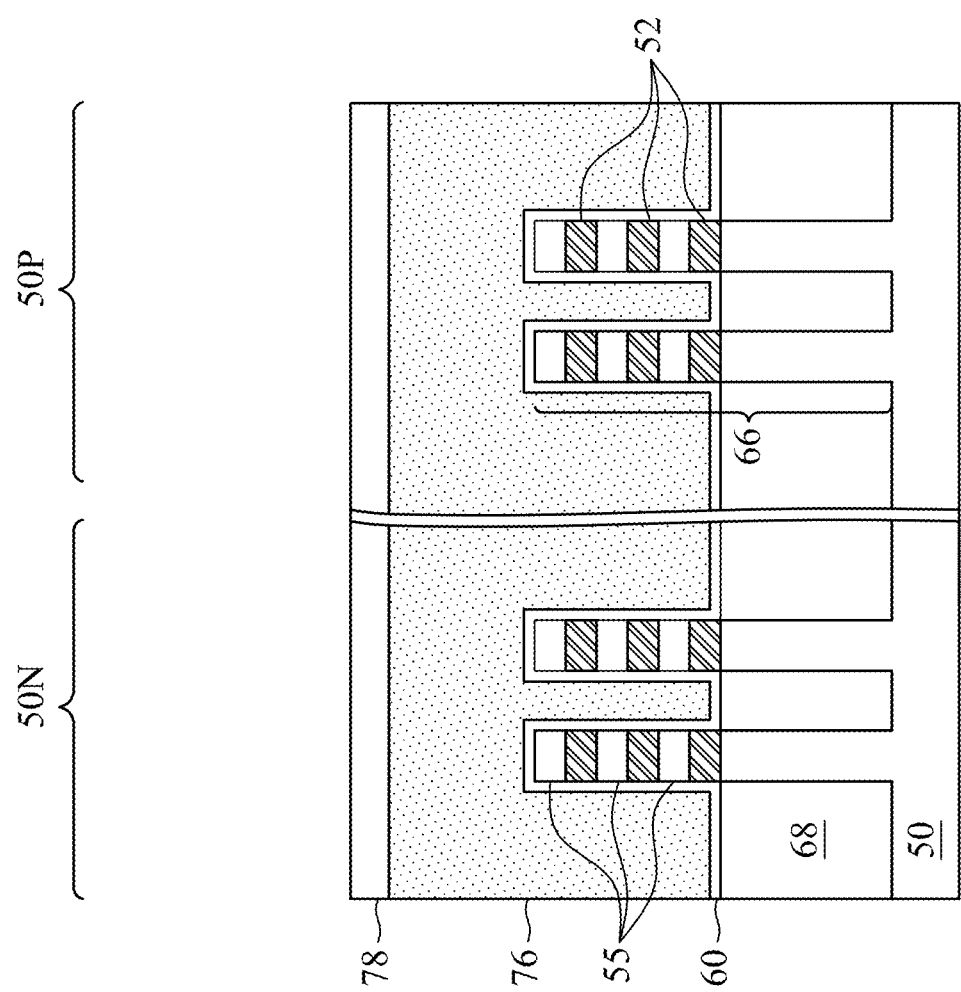
Figure 10B:
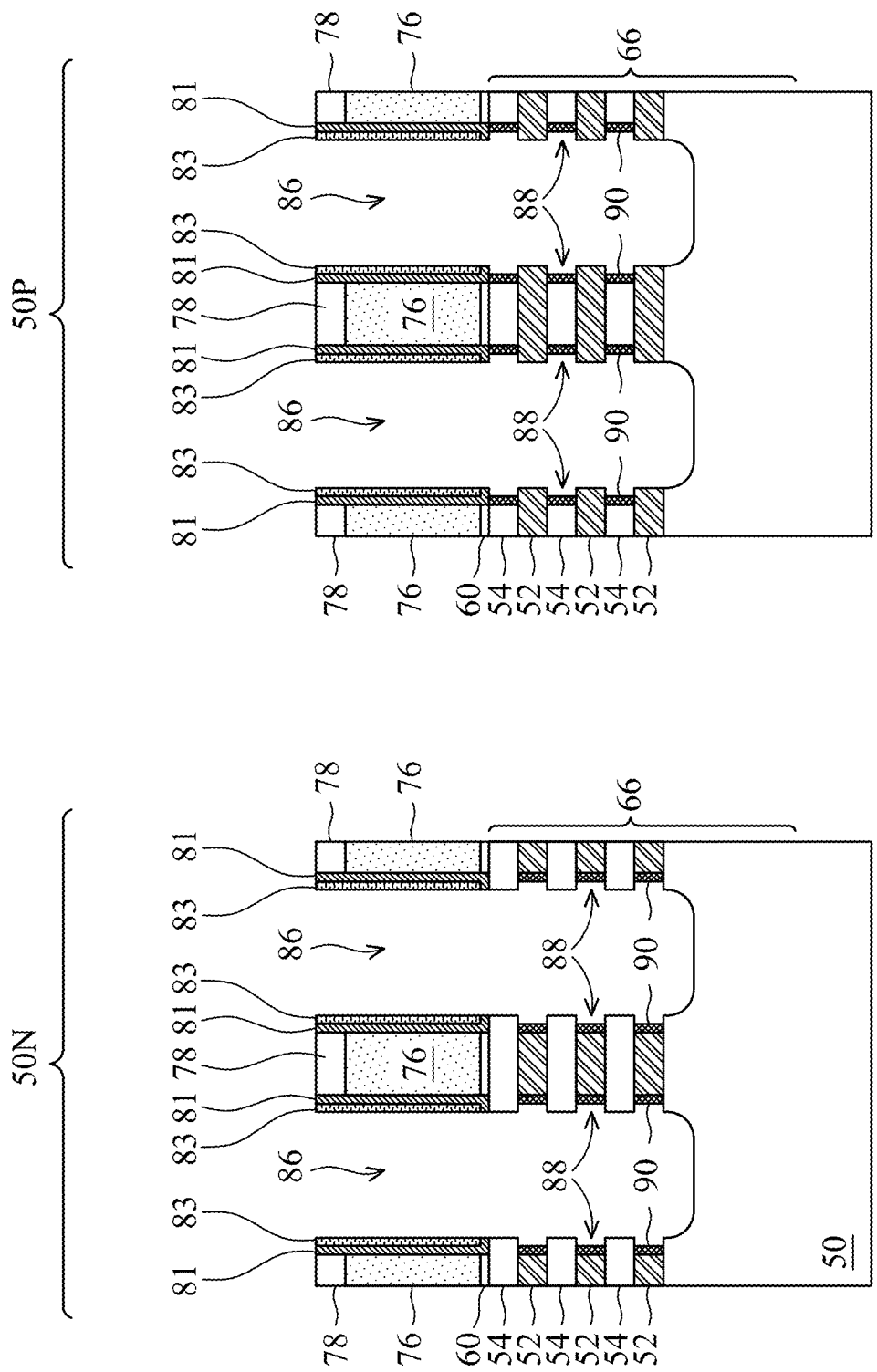

In FIGS. 9A and 9B, first recesses 86 are formed in the fins 66. The first recesses 86 extend through the first semiconductor layers 52 and the second semiconductor layers 54, and may also extend into the substrate 50. In various embodiments, the first recesses 86 may extend to a top surface of the substrate 50 without etching the substrate 50; the substrate 50 may be etched such that bottom surfaces of the first recesses 86 are disposed below the top surfaces of the STI regions 68; or the like. The first recesses 86 may be formed by etching the fins 66 using an anisotropic etching processes, such as a RIE, a NBE, or the like. The first spacers 81, the second spacers 83, and the masks 78 mask portions of the first semiconductor layers 52, the second semiconductor layers 54, and the substrate 50 during the etching processes used to form the first recesses 86. A single etch process may be used to etch each layer of the fins 66. In other embodiments, multiple etch processes may be used to etch the layers of the fins 66. Timed etch processes may be used to stop the etching of the first recesses 86 after the first recesses 86 reach a desired depth.

Figure 17A:
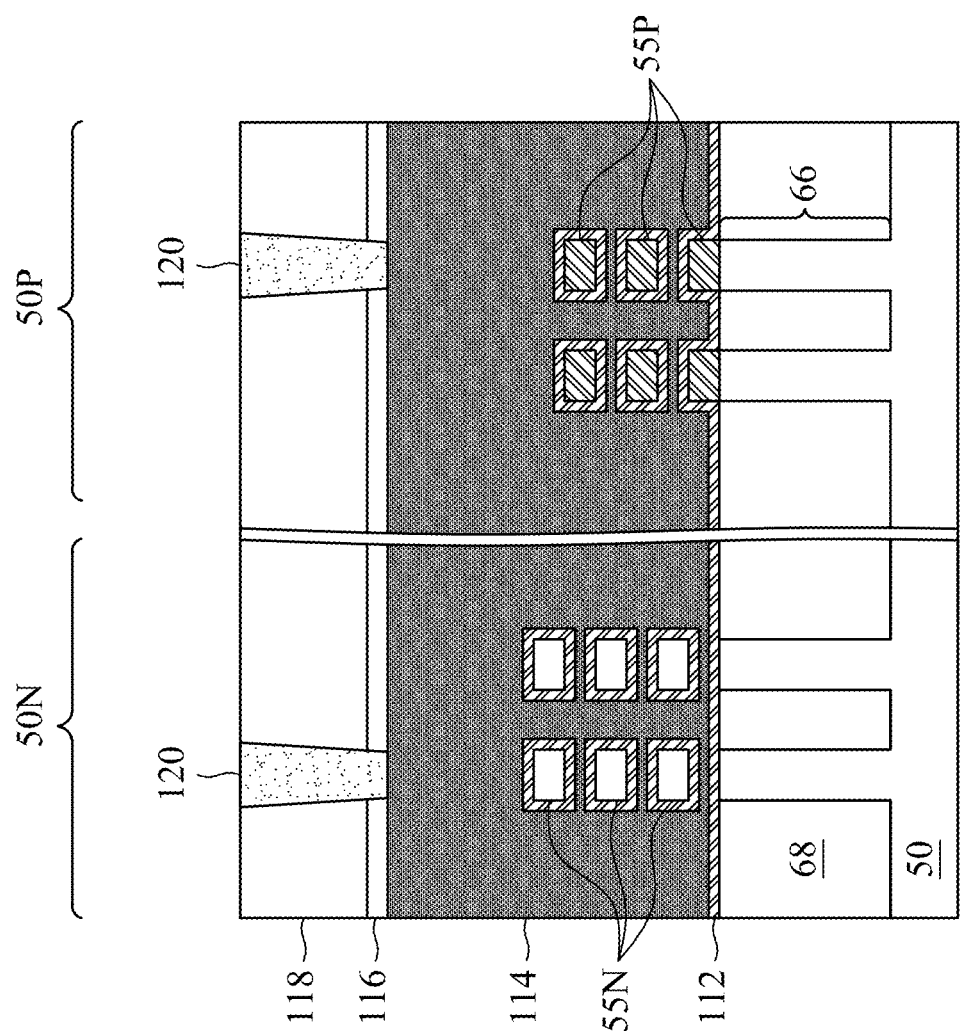
Figure 17B:
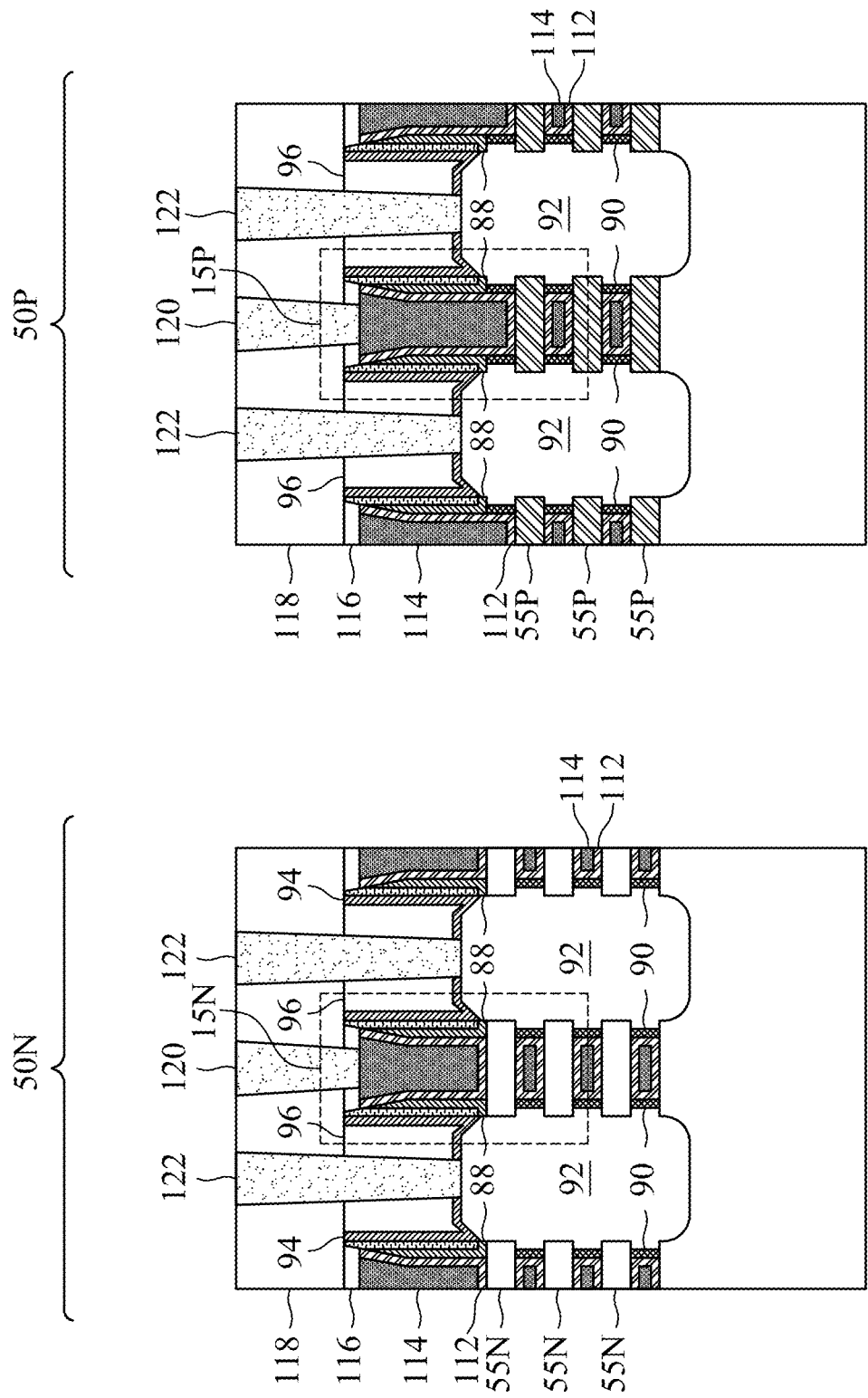

In FIGS. 7A and 17B, the first recesses 86 are optionally expanded. Specifically, portions of sidewalls of the first semiconductor layers 52 exposed by the first recesses 86 in the n-type region 50N may be etched to form sidewall recesses 88 in the n-type region 50N, and portions of sidewalls of the second semiconductor layers 54 exposed by the first recesses 86 in the p-type region 50P may be etched to form sidewall recesses 88 in the p-type region 50P. Although sidewalls of the first semiconductor layers 52 and the second semiconductor layers 54 in the sidewall recesses 88 are illustrated as being straight, the sidewalls may be concave or convex. The sidewalls may be etched using isotropic etching processes, such as wet etching or the like. The p-type region 50P may be protected using a mask while etchants selective to the first semiconductor materials are used to etch the first semiconductor layers 52 such that the second semiconductor layers 54 and the substrate 50 remain relatively unetched as compared to the first semiconductor layers 52 in the n-type region 50N. Similarly, the n-type region 50N may be protected using a mask while etchants selective to the second semiconductor materials are used to etch the second semiconductor layers 54 such that the first semiconductor layers 52 and the substrate 50 remain relatively unetched as compared to the second semiconductor layers 54 in the p-type region 50P. In embodiments where the first semiconductor layers 52 are formed of silicon germanium and the second semiconductor layers 54 are formed of silicon or silicon carbide, a wet etch process with tetramethylammonium hydroxide (TMAH), ammonium hydroxide (NH$_4$OH), or the like may be used to etch sidewalls of the first semiconductor layers 52 in the n-type region 50N, and a wet etch process with ammonium hydroxide-hydrogen peroxide mixture (APM), sulfuric acid-hydrogen peroxide mixture (SPM), or the like may be used to etch sidewalls of the second semiconductor layers 54 in the p-type region 50P.

Inner spacers 90 are formed in the sidewall recesses 88. As will be discussed in greater detail below, source/drain regions will be subsequently formed in the first recesses 86, and the first semiconductor layers 52 in the n-type region 50N and the second semiconductor layers 54 in the p-type region 50P will be subsequently replaced with corresponding gate structures. The inner spacers 90 act as isolation features between the subsequently formed source/drain regions and the subsequently formed gate structures. Further, the inner spacers 90 may be used to prevent damage to the subsequently formed source/drain regions by subsequent etching processes, such as etching processes used to subsequently form the gate structures.

The inner spacers 90 may be formed by depositing an inner spacer layer in the first recesses 86 and the sidewall recesses 88. The inner spacer layer may be deposited by a conformal deposition process, such as CVD, ALD, or the like. The inner spacer layer may be formed of a material such as silicon nitride or silicon oxynitride, although any suitable material, such as low-dielectric constant (low-k) materials having a k-value less than about 3.5, may be utilized. The inner spacer layer may then be etched to form the inner spacers 90. The etching may be an anisotropic etching process, such as RIE, NBE, or the like. Although outer sidewalls of the inner spacers 90 are illustrated as being recessed with respect to the sidewalls of the second semiconductor layers 54 in the n-type region 50N and recessed with respect to the sidewalls of the first semiconductor layers 52 in the p-type region 50P, the outer sidewalls of the inner spacers 90 may extend beyond or be flush with the sidewalls of the second semiconductor layers 54 and/or the first semiconductor layers 52, respectively. In other words, the inner spacers 90 may partially fill, completely fill, or overfill the sidewall recesses 88. Moreover, although the sidewalls of the inner spacers 90 are illustrated as being straight, the sidewalls of the inner spacers 90 may be concave or convex.

Figure 11A:
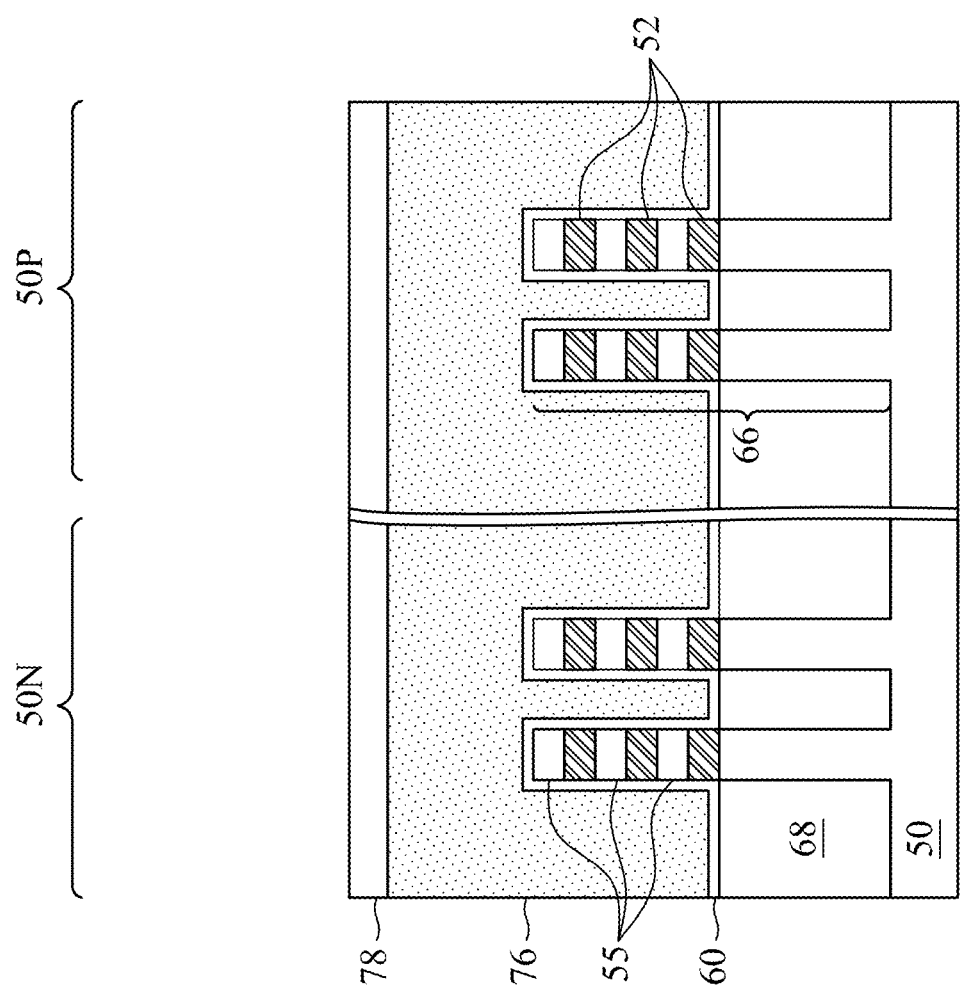
Figure 11B:
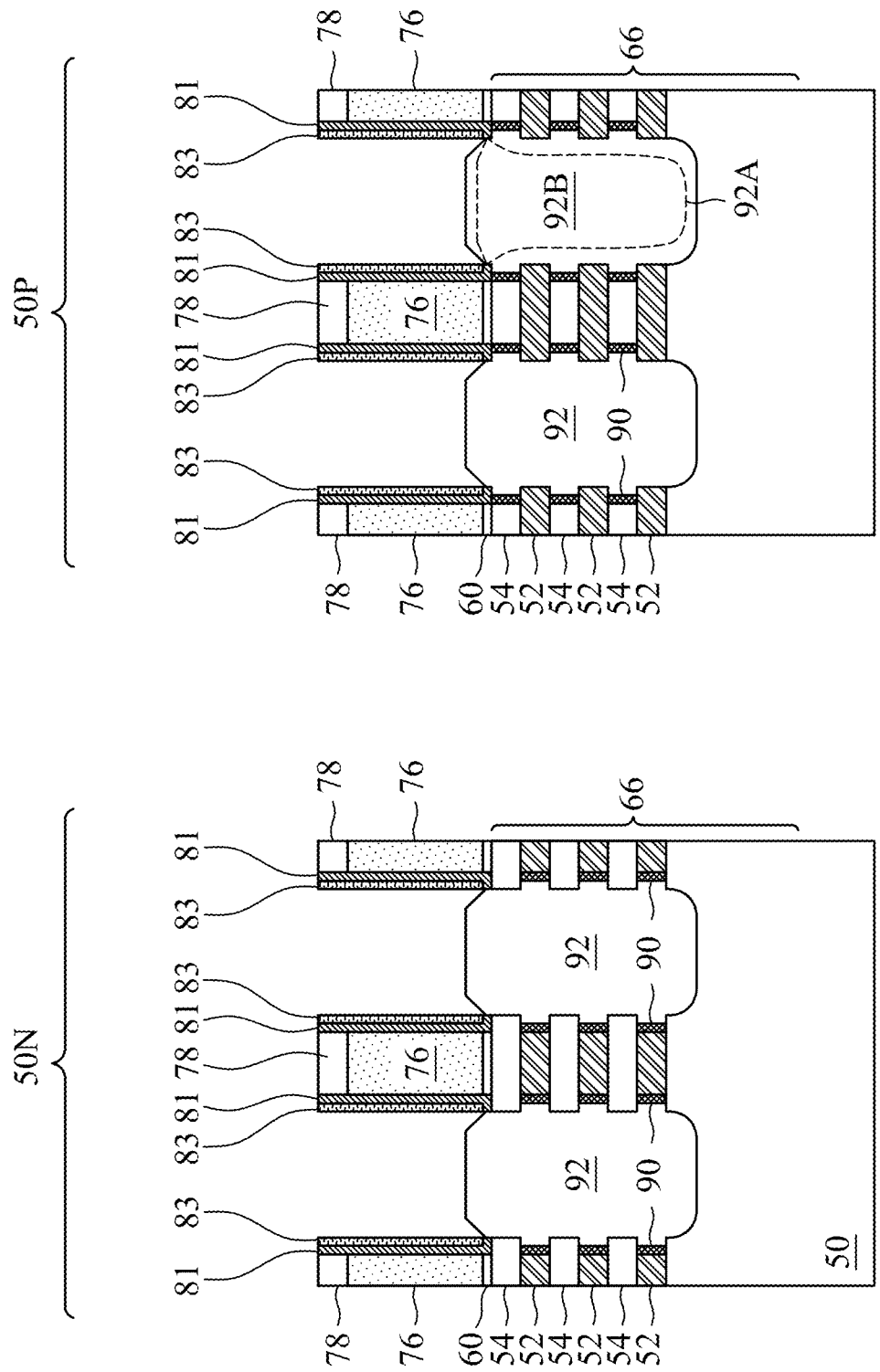
Figure 11C:
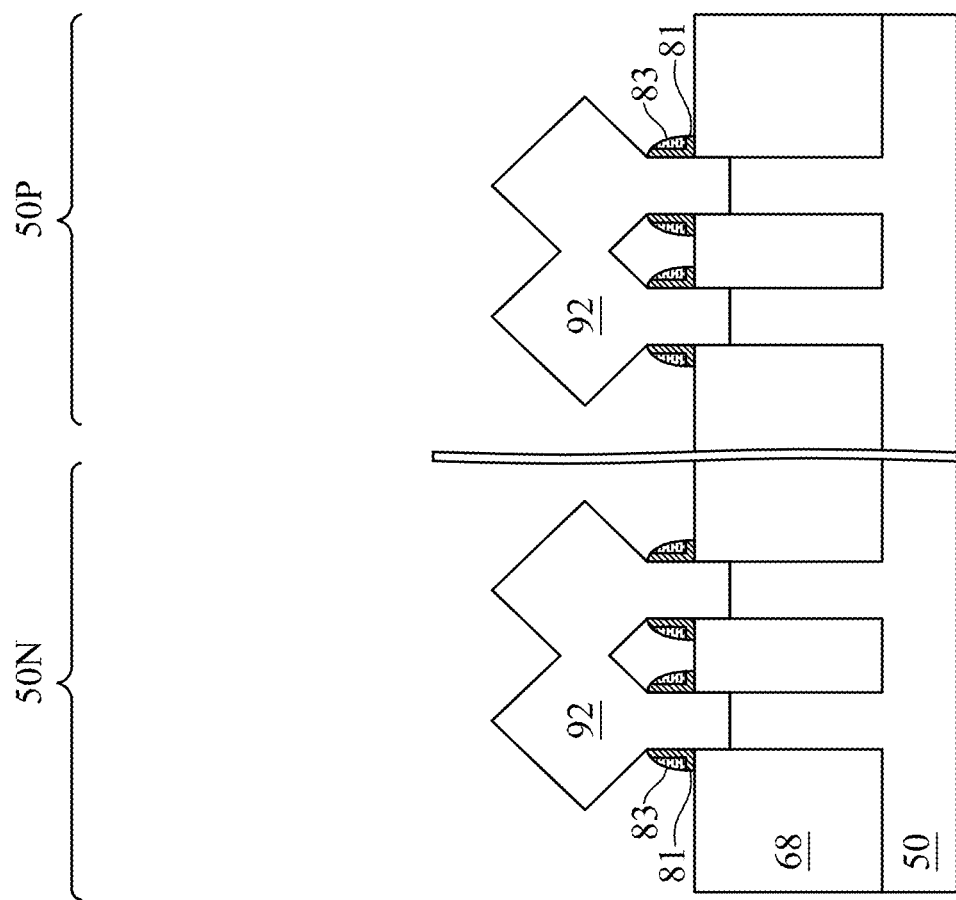
Figure 11D:
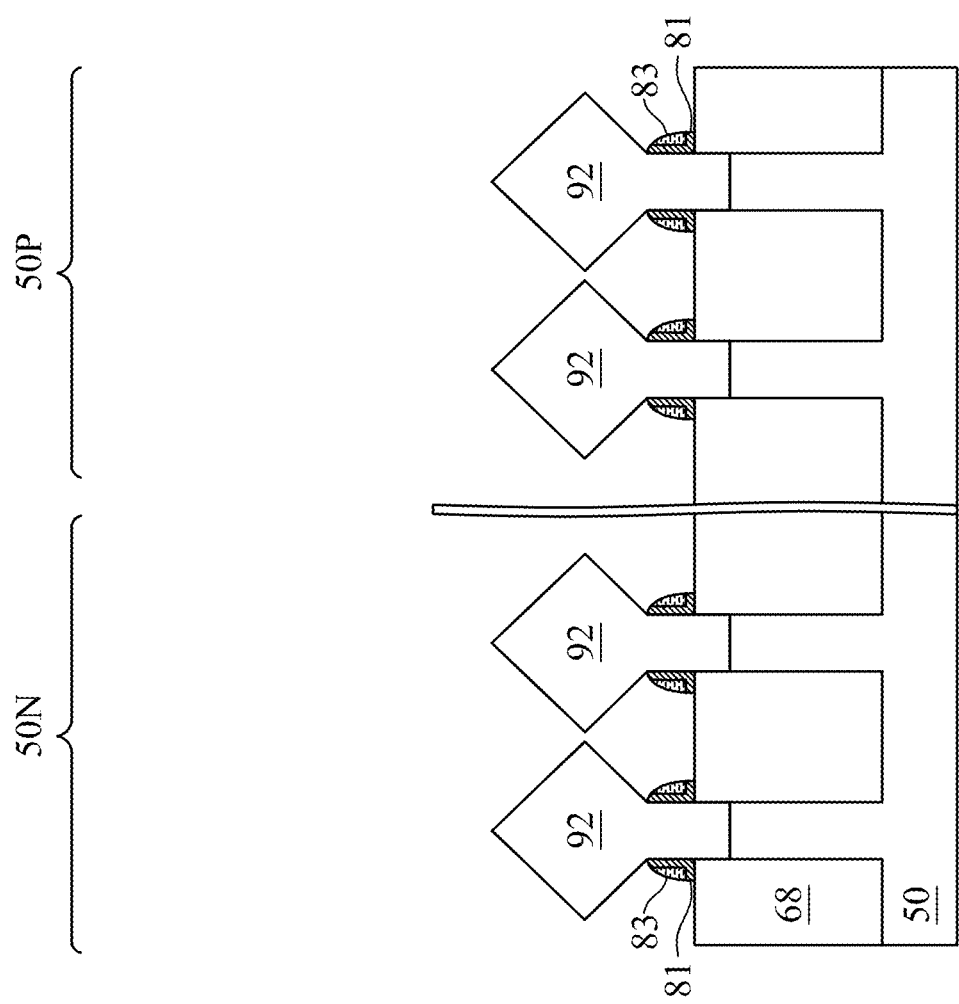

In FIGS. 11A and 11B, epitaxial source/drain regions 92 are formed in the first recesses 86. The epitaxial source/drain regions 92 are formed in the first recesses 86 such that each of the dummy gates 76 are disposed between respective neighboring pairs of the epitaxial source/drain regions 92. In some embodiments, the first spacers 81 and the second spacers 83 are used to separate the epitaxial source/drain regions 92 from the dummy gates 76 by an appropriate lateral distance so that the epitaxial source/drain regions 92 do not short out subsequently formed gates of the nano-FETs. Further, the inner spacers 90 may also be used to separate the epitaxial source/drain regions 92 from the first semiconductor layers 52 in the n-type region 50N and from the second semiconductor layers 54 in the p-type region 50P by an appropriate lateral distance so that the epitaxial source/drain regions 92 do not short out subsequently formed gates of the nano-FETs. The epitaxial source/drain regions 92 may be formed in contact with the inner spacers 90 (if present), and may extend past sidewalls of the second semiconductor layers 54 in the n-type region 50N and past sidewalls of the first semiconductor layers 52 in the p-type region 50P (if the sidewall recesses 88 are present). The epitaxial source/drain regions 92 can exert stress on the second semiconductor layers 54 in the n-type region 50N and on the first semiconductor layers 52 in the p-type region 50P, thereby improving performance.

The epitaxial source/drain regions 92 in the n-type region 50N may be formed by masking the p-type region 50P. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second semiconductor layers 54 are silicon, the epitaxial source/drain regions 92 in the n-type region 50N may include materials exerting a tensile strain on the second semiconductor layers 54, such as silicon, silicon carbide, phosphorous doped silicon carbide, silicon phosphide, or the like. The epitaxial source/drain regions 92 in the n-type region 50N may have surfaces raised from respective surfaces of the fins 66 and may have facets.

The epitaxial source/drain regions 92 in the p-type region 50P may be formed by masking the n-type region 50N. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first semiconductor layers 52 are silicon germanium, the epitaxial source/drain regions 92 in the p-type region 50P may include materials exerting a compressive strain on the first semiconductor layers 52, such as silicon germanium, boron doped silicon germanium, germanium, germanium tin, or the like. The epitaxial source/drain regions 92 in the p-type region 50P may also have surfaces raised from respective surfaces of the fins 66 and may have facets.

The epitaxial source/drain regions 92, and/or the fins 66 may be implanted with dopants to form source/drain regions, similar to the process previously discussed for forming lightly-doped source/drain regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92, upper surfaces of the epitaxial source/drain regions 92 have facets which expand laterally outward beyond sidewalls of the fins 66. In some embodiments, these facets cause adjacent epitaxial source/drain regions 92 of a same nano-FET to merge as illustrated by FIG. 11C. In other embodiments, adjacent epitaxial source/drain regions 92 remain separated after the epitaxy process is completed as illustrated by FIG. 11D. In the embodiments illustrated in FIGS. 11A and 11B, the first spacers 81 and the second spacers 83 may be formed covering portions of the sidewalls of the fins 66 that extend above the STI regions 68, thereby blocking the epitaxial growth. In some other embodiments, the spacer etch used to form the first spacers 81 and the second spacers 83 may be adjusted to remove the spacer material to allow the epitaxially grown regions to extend to the top surfaces of the STI regions 68.

The epitaxial source/drain regions 92 may include one or more semiconductor material layers. For example, the epitaxial source/drain regions 92 may include first semiconductor material layers 92A, second semiconductor material layers 92B, and third semiconductor material layers 92C. Any number of semiconductor material layers may be used for the epitaxial source/drain regions 92. Each of the first semiconductor material layers 92A, the second semiconductor material layers 92B, and the third semiconductor material layers 92C may be formed of different semiconductor materials and/or may be doped to different dopant concentrations. In some embodiments, the first semiconductor material layers 92A may have a dopant concentration less than the second semiconductor material layers 92B and greater than the third semiconductor material layers 92C. In embodiments in which the epitaxial source/drain regions 92 include three semiconductor material layers, the first semiconductor material layers 92A may be grown from the fins 66, the second semiconductor material layers 92B may be grown from the first semiconductor material layers 92A, and the third semiconductor material layers 92C may be grown from the second semiconductor material layers 92B.

Figure 12A:
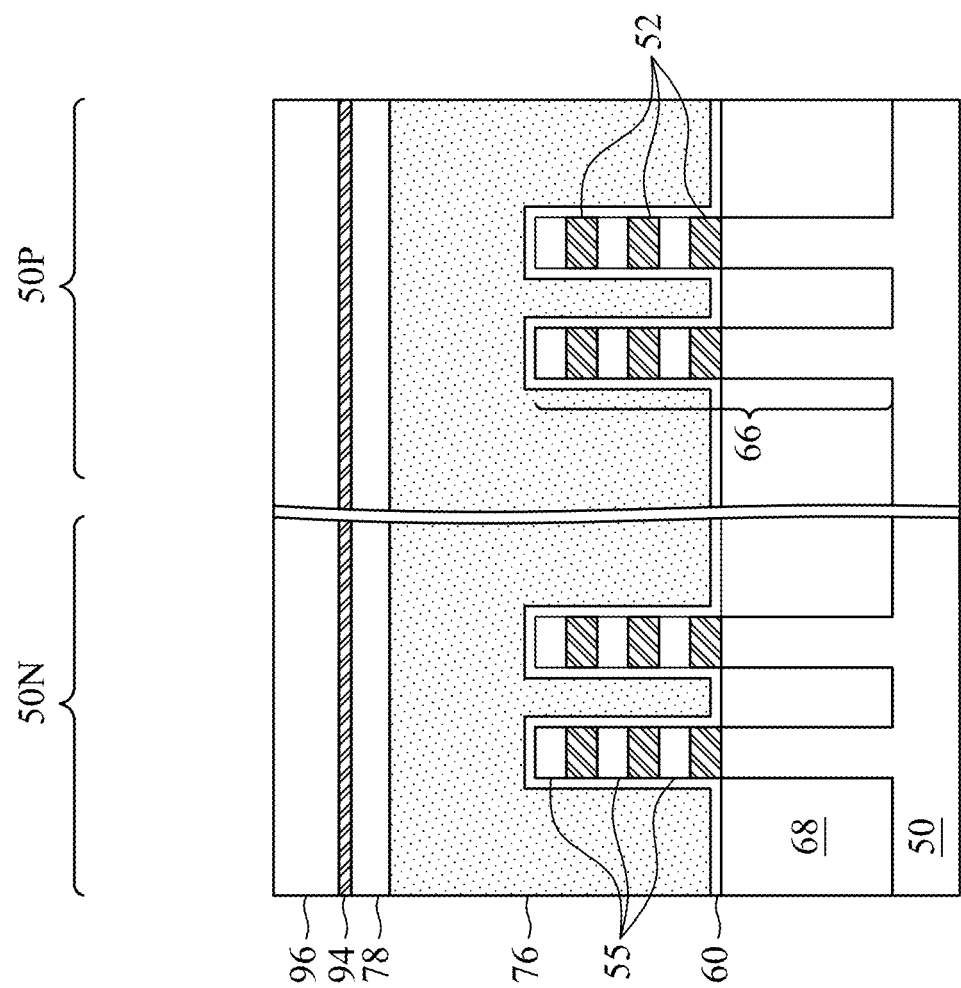
Figure 12B:
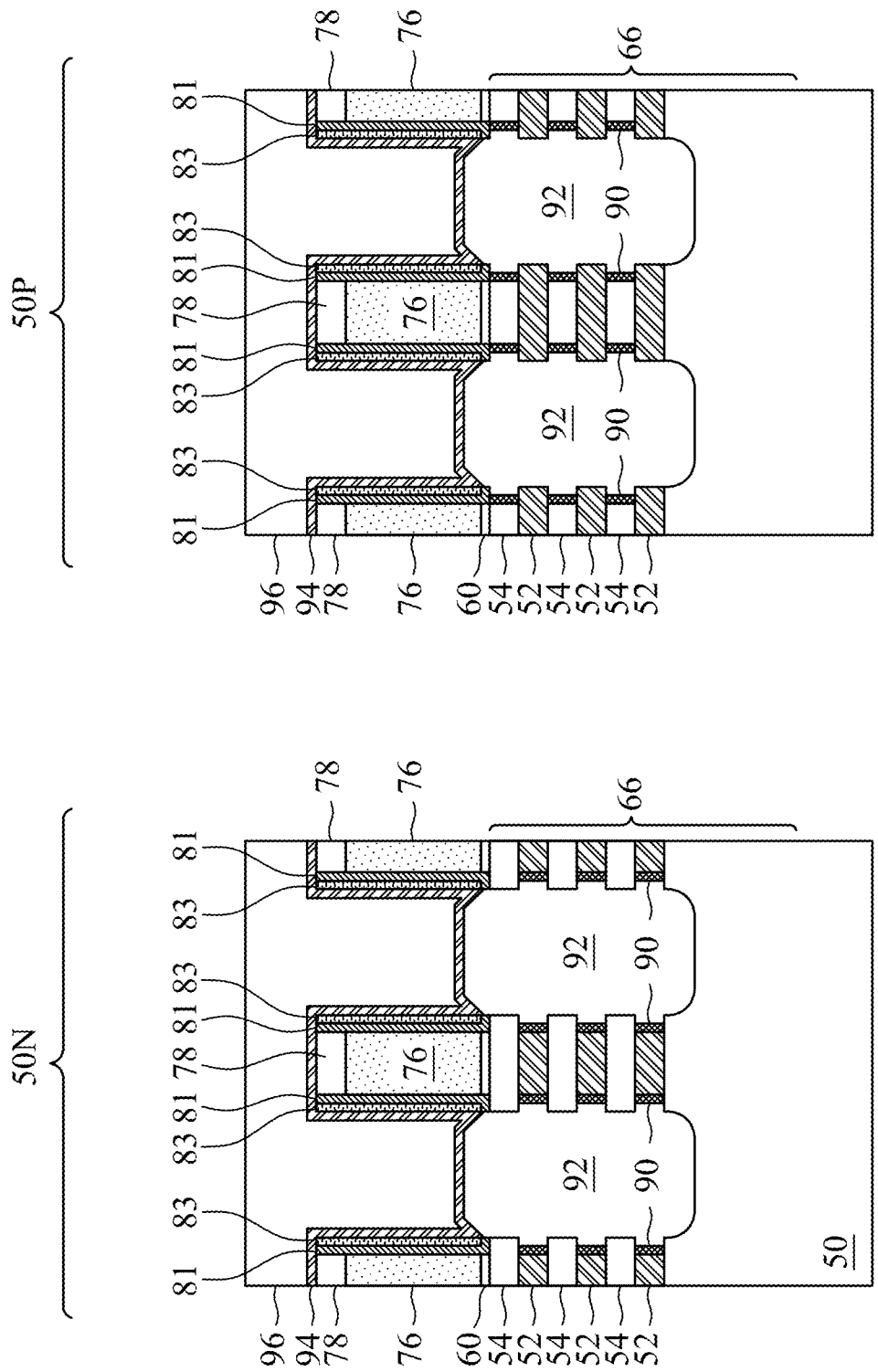

In FIGS. 12A and 12B, a first interlayer dielectric (ILD) layer 96 is deposited over the epitaxial source/drain regions 92, the first spacers 81, the second spacers 83, the masks 78 (if present) or the dummy gates 76, and the STI regions 68. The first ILD layer 96 may be formed of a dielectric material, and may be deposited by any suitable method, such as CVD, plasma-enhanced CVD (PECVD), or FCVD. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. Other insulation materials formed by any acceptable process may be used. In some embodiments, a contact etch stop layer (CESL) 94 is disposed between the first ILD layer 96 and the epitaxial source/drain regions 92, the first spacers 81, the second spacers 83, the masks 78 (if present) or the dummy gates 76, and the STI regions 68. The CESL 94 may include a dielectric material, such as, silicon nitride, silicon oxide, silicon oxynitride, or the like, having a different etch rate than the material of the first ILD layer 96.

Figure 13A:
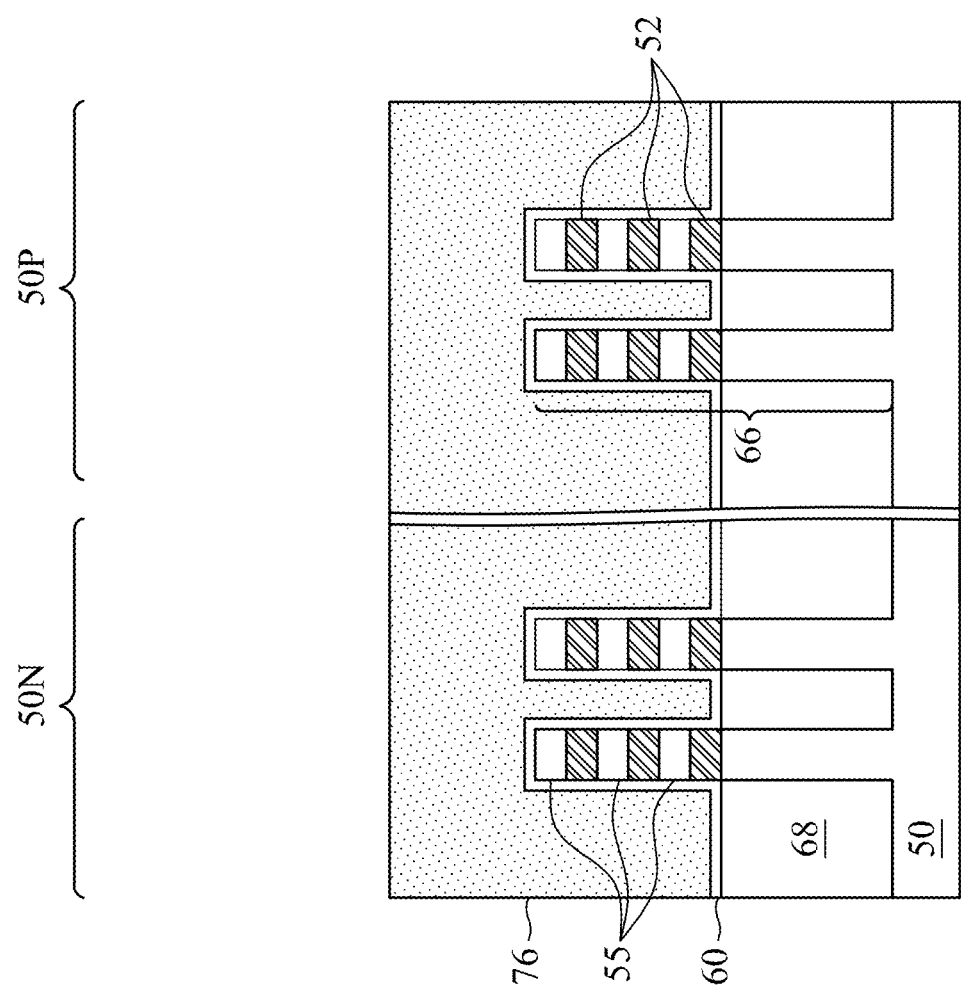
Figure 13B:
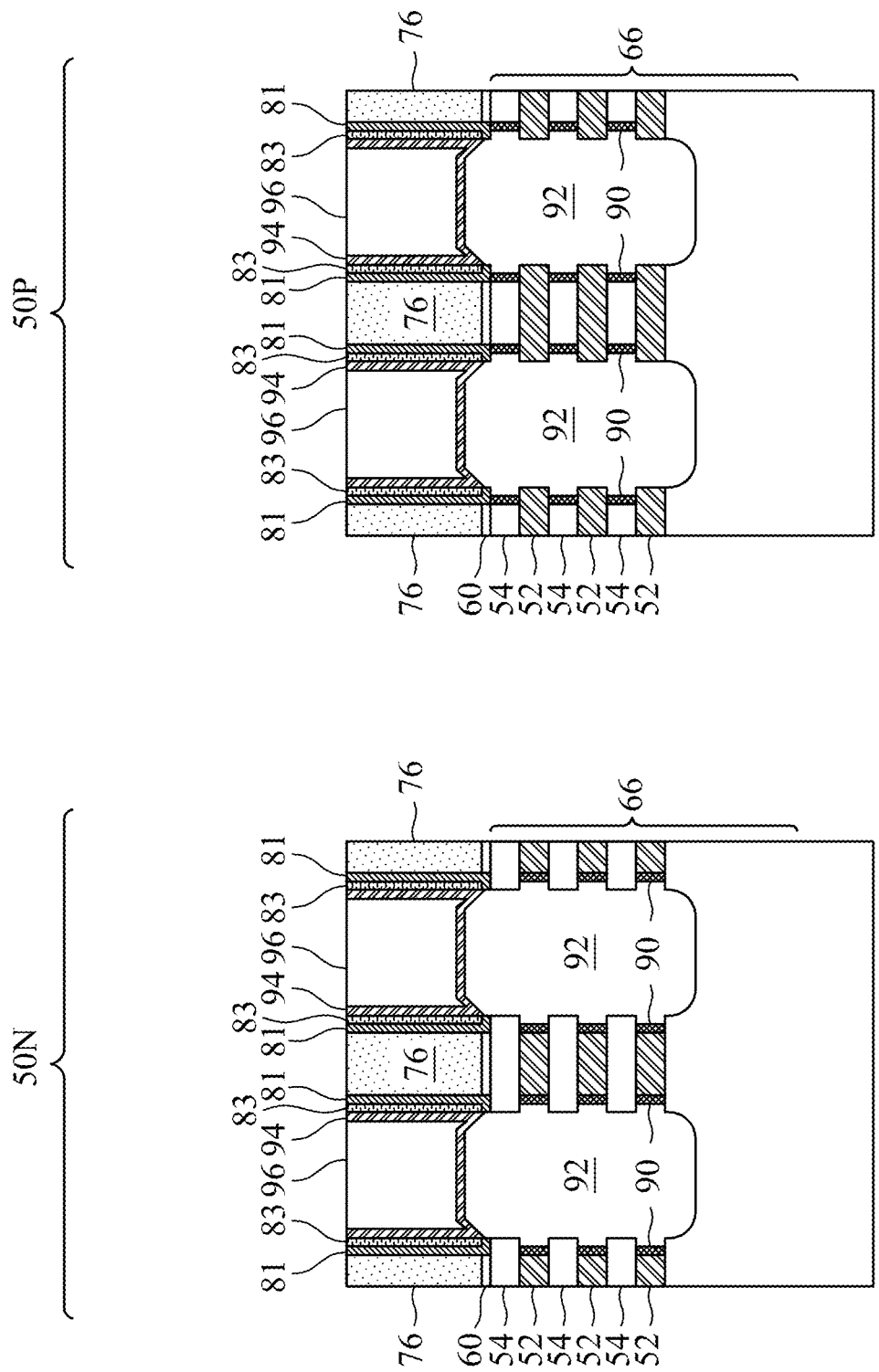

In FIGS. 13A and 13B, a planarization process, such as a CMP, may be performed to level the top surface of the first ILD layer 96 with the top surfaces of the masks 78 (if present) or the dummy gates 76. The planarization process may also remove the masks 78 on the dummy gates 76, and portions of the first spacers 81 and the second spacers 83 along sidewalls of the masks 78. After the planarization process, top surfaces of the dummy gates 76, the first spacers 81, the second spacers 83, and the first ILD layer 96 are coplanar (within process variations). Accordingly, the top surfaces of the dummy gates 76 are exposed through the first ILD layer 96. In some embodiments, the masks 78 may remain, in which case the planarization process levels the top surface of the first ILD layer 96 with top surface of the masks 78, the first spacers 81, and the second spacers 83.

Figure 14A:
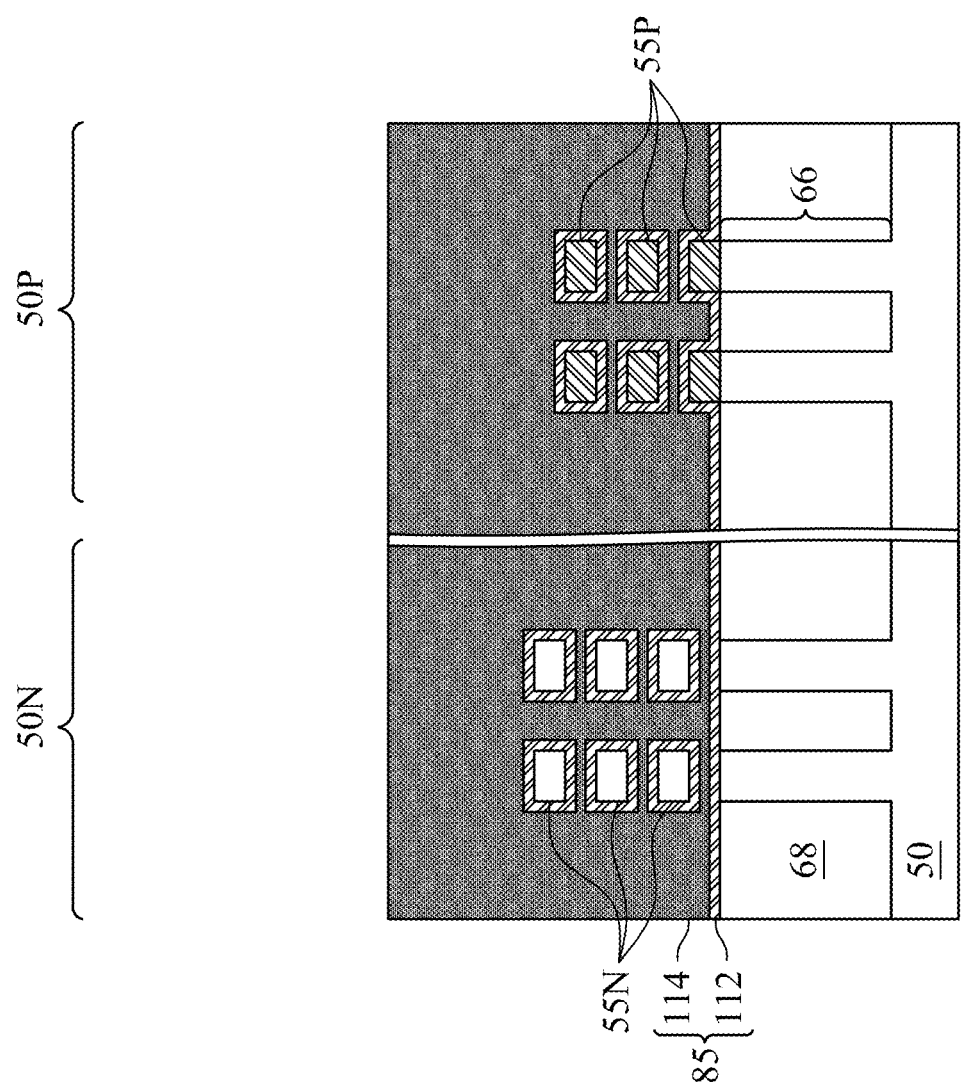
Figure 14B:
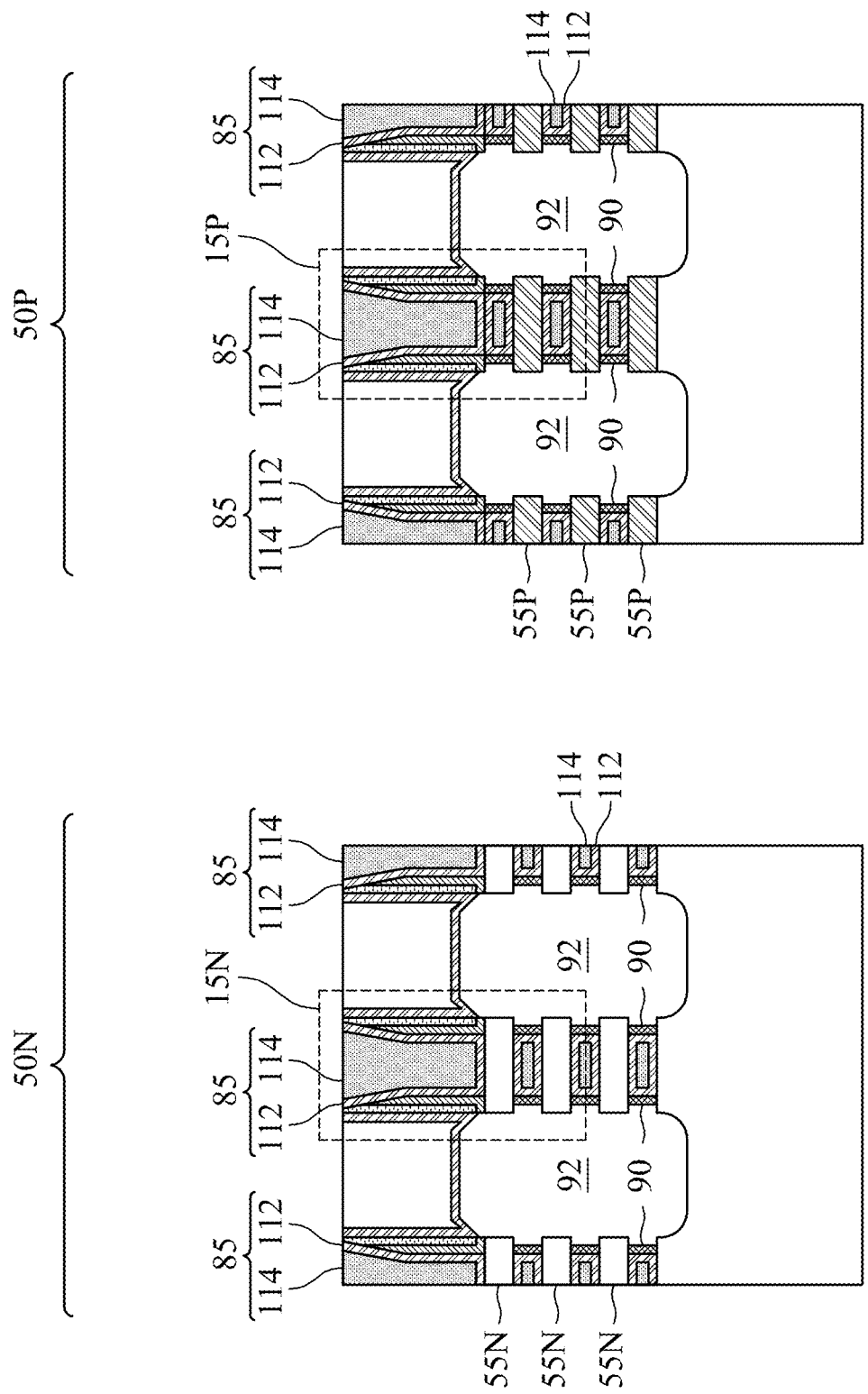

In FIGS. 14A and 14B, the first semiconductor layers 52 in the n-type region 50N and the second semiconductor layers 54 in the p-type region 50P are removed. The remaining semiconductor layers form nano-structures 55N, 55P, which are disposed between neighboring pairs of the epitaxial source/drain regions 92. Specifically, the remaining second semiconductor layers 54 in the n-type region 50N form nano-structures 55N, which will act as channel regions for n-type nano-FETs, and the remaining first semiconductor layers 52 in the p-type region 50P form nano-structures 55P, which will act as channel regions for p-type nano-FETs. Formation of the nano-structures 55N, 55P is discussed in further detail below with respect to FIGS. 15A through 15G.

The dummy gates 76 and optionally the dummy dielectrics 60 are removed and are replaced with gate structures 85, which wrap around the nano-structures 55. The gate structures 85 include gate dielectrics 112 and gate electrodes 114. Formation of the gate structures 85 is discussed in further detail below with respect to FIGS. 15A through 15G. As discussed further below, the gate electrodes 114 are formed having funnel shapes, where lower portions of the gate electrodes 114 have parallel opposing sidewalls, and upper portions of the gate electrodes 114 have slanted opposing sidewalls. Forming the gate electrodes 114 with funnel shapes can help avoid the formation of seams (or voids) in the gate electrodes 114, which can improve the work function of the gate electrodes 114 and reduce the internal gate resistance ($R_g$) of the gate electrodes 114. The performance and yield of the resulting nano-FETs may thus be improved.

FIGS. 15A through 15G are cross-sectional views of intermediate stages of a process for forming the nano-structures 55 (see FIG. 15D) and the replacement gate structures 85 (see FIG. 15G), in accordance with some embodiments. FIGS. 15A through 15G are illustrated along reference cross-section B-B in FIG. 1. An n-type region 15N in FIG. 14B, which is part of the n-type region 50N, and a p-type region 15P in FIG. 14B, which is part of the p-type region 50P, are illustrated in more detail. In the illustrated process, the dummy dielectrics 60 and dummy gates 76 are removed and replaced with, respectively, gate dielectrics 112 and gate electrodes 114. In some embodiments, the dummy dielectrics 60 are removed in a first region of a die (e.g., a core logic region) and remain in a second region of the die (e.g., an input/output region). In other words, the illustrated gate replacement process can be performed in the first region of the die (e.g., the core logic region), and a gate replacement process where the dummy dielectrics 60 are not removed can be performed in the second region of the die (e.g., the input/output region).

Figure 15A:
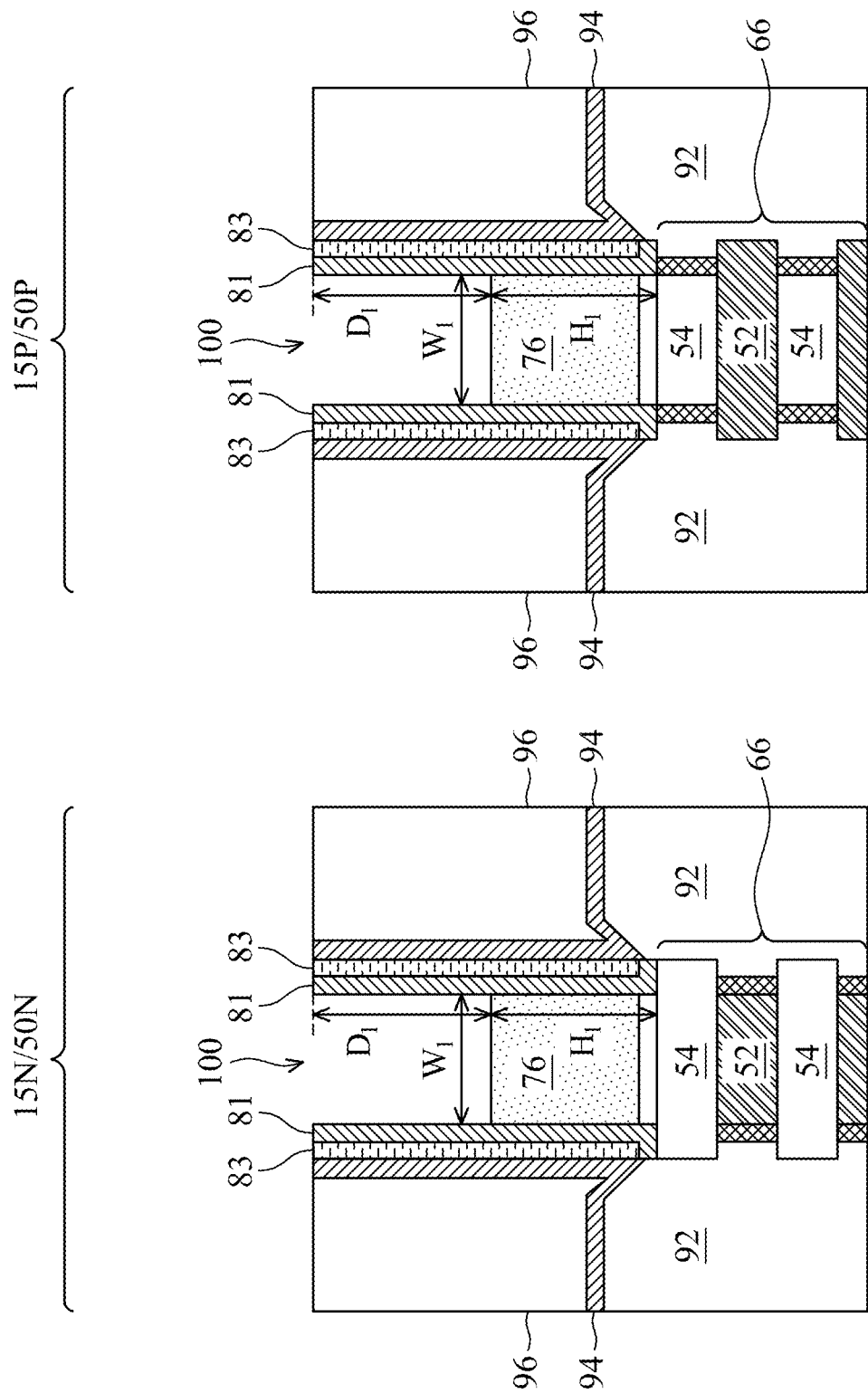

In FIG. 15A, the dummy gates 76 and the masks 78 (if present) are etched in one or more etching step(s), so that recesses 100 are formed. Each the recesses 100 exposes sidewalls of the first spacers 81. The recesses 100 can be small. For example, the recesses 100 can have widths $W_1$ in the range of about 4 nm to about 24 nm, and can have depths $D_1$ in the range of about 50 nm to about 120 nm. The widths $W_1$ of the recesses 100 can have a standard deviation of about 1 nm. The widths $W_1$ of the recesses 100 correspond to the lengths of the channel regions for the nano-FETs. Forming the channel regions for the nano-FETs to a short length can improve the performance of the resulting nano-FETs. However, forming the channel regions to a short length results in the recesses 100 having a high aspect ratio (e.g., a large ratio of the depth $D_1$ to the width $W_1$). When the recesses 100 have a high aspect ratio, seams (or voids) are likely to form in material deposited in the recesses 100, particularly when, as discussed further below, the recesses 100 are further enlarged. As discussed further below, the upper portions of the recesses 100 will be widened to have funnel shapes, which can help avoid the formation of such seams.

The dummy gates 76 can be recessed by a wet or dry etch. For example, the etching process may include a dry etch process using reaction gas(es) that selectively etch the dummy gates 76 at a faster rate than the first ILD layer 96, the first spacers 81, or the second spacers 83. Timed etch processes may be used to stop the etching of the dummy gates 76 after the recesses 100 reach a desired depth. Specifically, the depth of the recesses 100 is controlled so that the fins 66 and the dummy dielectrics 60 remain covered after the recesses 100 are formed. In some embodiments, the dummy gates 76 are recessed by an anisotropic dry etch process performed with methane ($CH_4$), fluorine (F), ammonia ($NH_3$), or the like, which may be performed for a duration in the range of about 30 seconds to about 180 seconds, which can allow the remaining portions of the dummy gates 76 to have a height $H_1$ (measured from the top surfaces of the fins 66) of less than about 5 nm. Performing the anisotropic dry etch process with parameters in these ranges allows the recesses 100 to be formed to a sufficient depth to both protect the fins 66 and the dummy dielectrics 60, and ensure the recesses 100 can be sufficiently widened in subsequent processing. Performing the anisotropic dry etch process with parameters outside of these ranges may not allow the recesses 100 to be formed to a sufficient depth to both protect the fins 66 and the dummy dielectrics 60, and ensure the recesses 100 can be sufficiently widened in subsequent processing.

Figure 15B:
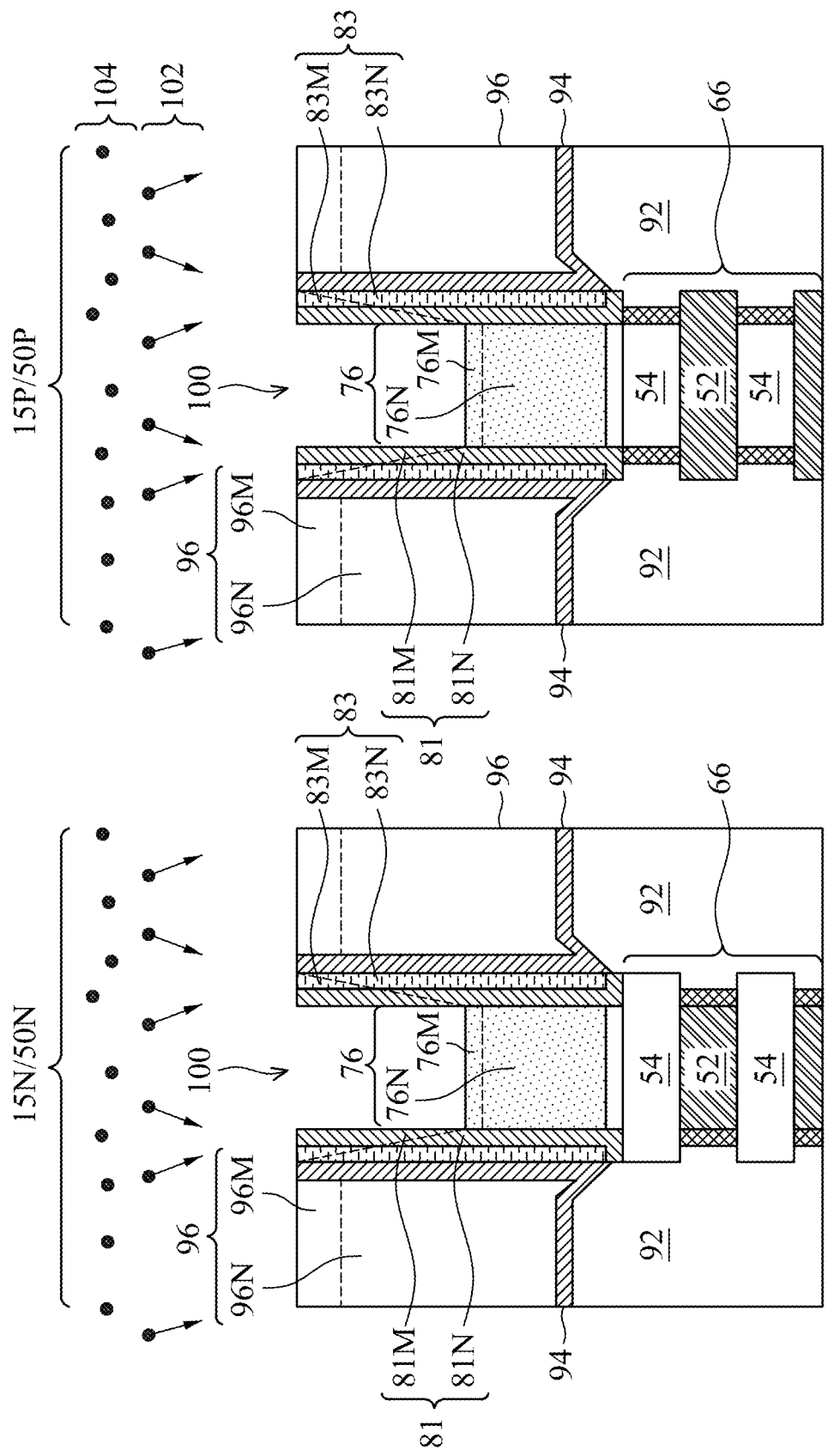

In FIG. 15B, an impurity is implanted in first regions of the spacers 81, 83, to modify an etch rate of the first regions of the spacers 81, 83 as compared to second regions of the spacers 81, 83 that have not been implanted with the impurity. As discussed in greater detail below, the first regions of the spacers 81, 83 will be etched to widen the recesses 100 to reduce or prevent the formation of voids or seams when subsequently forming replacement gate structures. The second regions of the spacers 81, 83 remain unmodified or less modified during/after the impurity implantation. In embodiments where the spacers 81, 83 are formed of silicon oxycarbonitride as discussed above, the impurity may be oxygen, and implantation may be by a plasma oxidation process. In another embodiment where the spacers 81, 83 are formed of silicon oxycarbonitride as discussed above, the impurity may be nitrogen, and implantation may be by a plasma nitridation process. The impurity implantation modifies regions 81M of the first spacers 81 and regions 83M of the second spacers 83, with unmodified regions 81N of the first spacers 81 and unmodified regions 83N of the second spacers 83 being unaffected by the impurity implantation (or at least less affected than the modified regions 81M, 83M). In some embodiments, the impurity implantation also modifies regions 96M of the first ILD layer 96, with unmodified regions 96N of the first ILD layer 96 being unaffected by the impurity implantation. In some embodiments, the impurity implantation also modifies regions 76M of the dummy gates 76, with unmodified regions 76N of the dummy gates 76 being unaffected by the impurity implantation. The exposed portions of the CESL 94 are thin, and so the CESL 94 remains substantially unaffected by the impurity implantation.

The modified regions 81M and the modified regions 83M are impurity-rich. For example, the modified regions 81M, 83M can both include silicon oxycarbonitride having a greater concentration (by atomic percent) of oxygen or nitrogen than, respectively, the unmodified regions 81N and the unmodified regions 83N. In some embodiments, the unmodified regions 81N, 83N retain their initial composition. In other words, the final composition of the unmodified regions 81N, 83N is the same as the initial composition of the unmodified regions 81N, 83N. In some embodiments, the unmodified regions 81N, 83N are slightly modified, but are less modified than the modified regions 81M, 83M. In other words, the final composition of the unmodified regions 81N, 83N is closer to their initial composition than the final composition of the modified regions 81M, 83M. As discussed further below, an etch selective to the modified (e.g., impurity-rich) regions will subsequently be performed to remove the modified regions 81M and the modified regions 83M, thus widening the recesses 100.

In some embodiments, the impurity implantation is performed by a plasma implantation process. The plasma implantation process may be performed in a chamber, with a chuck in the chamber supporting the substrate 50. Precursor gases are provided to the chamber, and a plasma generator can be used to generate plasma from the precursor gases. The plasma generator may be an inductively coupled plasma (ICP) generator, a transformer coupled plasma (TCP) generator, a remote plasma generator, or the like.

During the plasma implantation process, a gas source is provided (e.g., flowed) over the substrate 50. The gas source includes an impurity source precursor gas and a carrier gas. Suitable impurity source precursor gases include oxygen gas ($O_2$) when oxygen is implanted and nitrogen gas ($N_2$) when nitrogen is implanted. Suitable carrier gases include xenon, helium, argon, neon, krypton, radon, the like, or combinations thereof. For example, in embodiments where oxidation is performed, the gas source includes oxygen gas as the impurity source precursor gas and argon, oxygen, helium, neon, or xenon as the carrier gas, where the impurity source precursor gas can be provided at a flow rate in the range of about 0 sccm to about 500 sccm and the carrier gas can be provided at a flow rate in the range of about 10 sccm to about 1000 sccm. Likewise, in embodiments where nitridation is performed, the gas source includes nitrogen gas as the impurity source precursor gas and argon, ammonia, nitrogen, helium, neon, or xenon as the carrier gas, where the impurity source precursor gas can be provided at a flow rate in the range of about 0 sccm to about 500 sccm and the carrier gas can be provided at a flow rate in the range of about 10 sccm to about 1000 sccm.

Radio frequency (RF) power is generated by the plasma generator to produce a plasma from the gas source. The plasma includes impurity ions 102 (e.g., oxygen ions, nitrogen ions, etc.) and impurity radicals 104 (e.g., oxygen radicals, nitrogen radicals, etc.). A bias is generated between the plasma generator and the chuck supporting the substrate 50. In some embodiments, an applied RF bias is pulsed between a low power and a high power. In some embodiments, an applied direct current (DC) bias is pulsed between a low voltage and a high voltage. During application of the bias, the impurity ions 102 are accelerated across the plasma and implanted into the spacers 81, 83 to form the modified regions 81M, 83M. The impurity ions 102 are also implanted into the first ILD layer 96 to form the modified regions 96M. The plasma generation power can be in the range of about 30 watts to about 4000 watts. In such embodiments, when the bias is not applied, the impurity ions 102 have a total energy in the range of about 0.5 eV to about 25 eV and the impurity radicals 104 have a total energy in the range of about 0.5 eV to about 10 eV. The plasma implantation process may be performed using a RF bias having a low power of about zero and a high power of up to about 100 watts. The plasma implantation process may be performed using a DC bias having a low voltage of about zero and a high voltage of up to about 100 V. In such embodiments, application of the bias increases the total energy of the impurity ions 102 by an amount in the range of about 3 eV to about 10 eV and does not increase the total energy of the impurity radicals 104.

During the plasma implantation process, the impurity ions 102 collide with the impurity radicals 104, which can result in a low directionality of implantation, causing shadowing during the implantation. In other words, the implant is performed in a non-directional manner. In accordance with some embodiments, the generated plasma includes few impurity ions 102 and many impurity radicals 104. For example, the generated plasma can have a plasma density in the range of about $10^9$ cm$^{-3}$ to about $10^{12}$ cm$^{-3}$. Generating the plasma with many impurity radicals 104 results in the impurity ions 102 colliding with more impurity radicals 104 during implant, thus increasing the amount of shadowing and resulting in less impurity ions 102 being directed towards the remaining portions of the dummy gates 76. As a result, a majority of the impurity ions 102 are implanted at an acute incident angle with respect to a major surface of the structure (e.g., a topmost surface of the first ILD layer 96 or a major surface of the substrate 50). The incident angle can be small, such as in the range of about 3 degrees to about 50 degrees.

The amount of shadowing during the plasma implantation process can be increased by controlling the environment when generating the plasma. Specifically, the temperature, pressure, and plasma generation power, and biasing amount can all affect the amount of impurity ions 102 and impurity radicals 104 that are generated. In accordance with some embodiments, the plasma is generated with a low temperature, a low pressure, a low plasma generation power, and a low biasing amount. For example, the plasma can be generated at a temperature in the range of about room temperature (e.g., about 20° C.) to about 650° C., at a pressure in the range of about 5 mTorr to about 500 mTorr, with the plasma generation power discussed above, and with the biasing amount discussed above. Such a plasma generation environment results in a large amount of shadowing during the implantation. The plasma implantation process can be performed for a duration in the range of about 3 seconds to about 300 seconds, resulting in a dosage of the implanted oxygen being in the range of about $10^{12}$ cm$^{-3}$ to about $10^{19}$ cm$^{-3}$. Performing the plasma implantation process with parameters in these ranges allows the modified regions 81M, 83M to have sufficient etch selectivity with the unmodified regions 81N, 83N so that the unmodified regions 81N, 83N are protected from etching during subsequent removal of the modified regions 81M, 83M. Performing the plasma implantation process with parameters outside of these ranges may not allow the modified regions 81M, 83M to have sufficient etch selectivity with the unmodified regions 81N, 83N, and thus the unmodified regions 81N, 83N may not be protected from etching during subsequent removal of the modified regions 81M, 83M.

When the recesses 100 have a high aspect ratio, implanting the impurity ions 102 with a large amount of shadowing results in less impurity ions 102 being implanted in lower portions of the recesses 100 than in upper portions of the recesses 100. Further, because of the large amount of shadowing, the modified regions 81M, 83M are formed by implanting the top surfaces and exposed sidewalls of the spacers 81, 83, and thus the modified regions 81M, 83M have right triangular shapes. The shape of the spacers 81, 83 resulting from the triangular-shaped modified regions 81M, 83M is discussed further below.

Figure 15C:
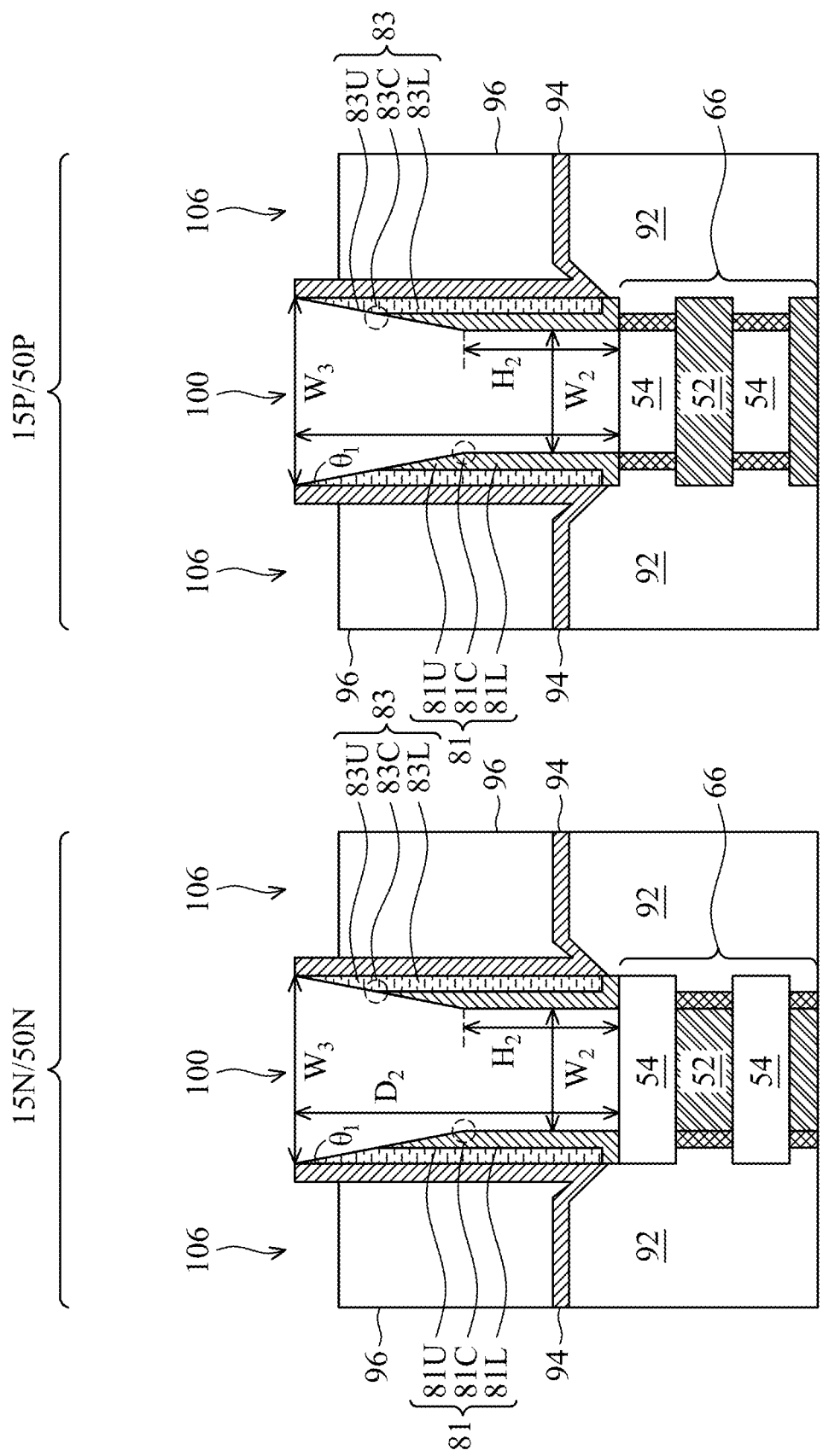

In FIG. 15C, the remaining portions of the dummy gates 76 are removed in one or more etching step(s), so that the recesses 100 are expanded to expose the dummy dielectrics 60. The dummy gates 76 can be removed by a wet or dry etch, which etches both the modified regions 76M and the unmodified regions 76N of the dummy gates 76. For example, the etching process may include a dry etch process using reaction gas(es) that selectively etch the dummy gates 76 at a faster rate than the first ILD layer 96, the first spacers 81, or the second spacers 83. In some embodiments, the dummy gates 76 are removed by an anisotropic dry etch process performed with the same etchants as those discussed with respect to FIG. 15A (e.g., the anisotropic dry etch process used to initially recess the dummy gates 76), but the parameters of the anisotropic dry etch process are modified to increase the etch selectivity to the material of the dummy gates 76. During dry etching, a bias is generated between a plasma generator and a chuck supporting the substrate 50. In some embodiments, the anisotropic dry etch used to initially recess the dummy gates 76 and the anisotropic dry etch used to remove the remaining portions of the dummy gates 76 are performed with different biases, e.g., a different DC bias and/or a different RF bias. In some embodiments, the dry etch for removing the remaining portions of the dummy gates 76 can be performed using a DC bias having a low voltage of about zero and a high voltage of up to about 300 V. In some embodiments, the dry etch for removing the remaining portions of the dummy gates 76 can be performed using a RF bias having a low power of about zero and a high power of up to about 1000 watts. Performing the dry etch with bias(es) in these ranges can increase the anisotropy of the dry etching, which may increase the etch selectivity to the material of the dummy gates 76.

The modified regions 81M, 83M of the spacers 81, 83 are then removed in one or more etching step(s), so that the upper portions of the recesses 100 are widened. The etching step(s) are selective to the impurity implanted in the spacers 81, 83. For example, when the spacers 81, 83 include silicon oxycarbonitride and the modified regions 81M, 83M are oxygen-rich or nitrogen-rich, the etching process may include a dry etch using reaction gas(es) that are selective to, respectively, oxides or nitrides. Because the modified regions 81M, 83M have a greater concentration of the impurity than the unmodified regions 81N, 83N, the etching process etches the modified regions 81M, 83M at a greater rate than the unmodified regions 81N, 83N. For example, the etch rate of the modified regions 81M, 83M can be from about 1.1 to about 10 times greater than the etch rate of the unmodified regions 81N, 83N relative the etching process. In some embodiments, the dummy dielectrics 60 can be formed of a material that has a large composition of the impurity, and so the dummy dielectrics 60 can also be etched at a high rate by the etching process. For example, when the dummy dielectrics 60 are oxides and the impurity implanted in the modified regions 81M, 83M is oxygen, the etch selective to oxygen-rich regions can also etch the dummy dielectrics 60. Specifically, during removal of the modified regions 81M, 83M, the dummy dielectrics 60 can be removed to deepen the recesses 100. Finally, as noted above, modified regions 96M of the first ILD layer 96 can also be formed. The modified regions 96M of the first ILD layer 96 can also be etched at a high rate by the etching process to form recesses 106.

In some embodiments, the etching process is an anisotropic dry etch performed with nitrogen trifluoride ($NF_3$), ammonia ($NH_3$), hydrogen fluoride (HF) or the like. The etching gas solution can be flowed over the substrate 50, such as in the recesses 100, while no plasma is generated. The dry etch can be performed for a duration in the range of about 1 second to about 250 seconds, and at a temperature of from about room temperature (e.g., about 20° C.) to about 350° C. The dry etch converts the material of the modified regions 81M, 83M, the modified regions 96M, and the dummy dielectrics 60, to byproducts that can be evacuated from the recesses 100 by, e.g., a vacuum. For example, when the impurity is oxygen, the anisotropic dry etch can be performed with HF, $NH_3$, $NF_3$, or combinations thereof to produce byproducts such as ammonium fluorosilicate, silicon tetrafluoride, water, or combinations thereof. Likewise, when the impurity is nitrogen, the anisotropic dry etch can be performed with HF, $NH_3$, $NF_3$, or combinations thereof to produce byproducts such as ammonium fluorosilicate, silicon tetrafluoride, or combinations thereof.

In another embodiment where the dummy dielectrics 60 are not formed of a material that has a large composition of the impurity, the modified regions 81M, 83M of the spacers 81, 83 and the modified regions 96M of the first ILD layer 96 can be removed in a first etching process, and the dummy dielectrics 60 can be removed in a second etching process.

After the etching process, the unmodified regions 81N, 83N of the spacers 81, 83 and the unmodified regions 96N of the first ILD layer 96 remain. The remaining portions of the first spacers 81 have upper portions 81U and lower portions 81L. The remaining portions of the second spacers 83 have upper portions 83U and lower portions 83L. The upper portions 81U, 83U and the lower portions 81L, 83L together form funnel shapes for the recesses 100. The upper portions 81U, 83U have angled opposing sidewalls that meet at an apex. The opposing sidewalls of the upper portions 81U, 83U form an interior angle $\theta_1$. The angle $\theta_1$ can be in the range of about 3 degree to about 50 degrees. The widths of the upper portions 81U, 83U decrease continually in a direction extending away from the top surfaces of the fins 66. The widths of the lower portions 81L, 83L are constant along the direction extending away from the top surfaces of the fins 66. The lower portions 81L, 83L have parallel opposing sidewalls.

As noted above, in some embodiments, the regions 81N, 83N of the spacers 81, 83 are not entirely unmodified, but rather are less modified than the regions 81M, 83M. Specifically, the regions 81N, 83N can be implanted with less of the impurity than the regions 81M, 83M. As a result, in such embodiments, the upper portions 81U, 83U of the spacers 81, 83 can contain some of the impurity, while the lower portions 81L, 83L of the spacers 81, 83 do not contain the impurity. For example, when oxygen is implanted, the upper portions 81U, 83U can comprise $SiO_xN_yC_{1-x-y}$, where x and y are in the range of 0 to 1 and x is greater than y, and the lower portions 81L, 83L of the spacers 81, 83 can comprise $SiO_xN_yC_{1-x-y}$, where x and y are in the range of 0 to 1 and x is less than, equal to, or greater than y.

The recesses 100 are enlarged by removal of the modified regions 81M, 83M and the dummy dielectrics 60. For example, the recesses 100 can have depths $D_2$ in the range of about 55 nm to about 125 nm, can have lower widths $W_2$ in the range of about 4 nm to about 24 nm, and can have upper widths $W_3$ in the range of about 6 nm to about 40 nm. The depths $D_2$ are larger than the depths $D_1$ (see FIG. 15A) by nature of removing the dummy gates 76 and the dummy dielectrics 60. The lower widths $W_2$ are located at the bottoms of the recesses 100, and are larger than the widths $W_1$ (see FIG. 15A) because the unmodified regions 81N, 83N of the spacers 81, 83 do undergo some etching, albeit less etching than the modified regions 81M, 83M of the spacers 81, 83. The lower widths $W_2$ of the recesses 100 can have a standard deviation of about 2 nm. The standard deviation of the lower widths $W_2$ can be larger than the standard deviation of the widths $W_1$. The lower widths $W_2$ of the recesses 100 correspond to the lengths of the channel regions for the nano-FETs. Forming the channel regions for the nano-FETs to a short length can improve the performance of the resulting nano-FETs. The upper widths $W_3$ are located at the tops of the recesses 100, and are larger than the lower widths $W_2$.

The spacers 81, 83 have interior corners 81C, 83C at, respectively, the interfaces of the upper portions 81U, 83U and the lower portions 81L, 83L. In the illustrated embodiment, the interior corners 81C, 83C have sharply-defined profiles. In some embodiments (discussed further below), the interior corners 81C, 83C do not have sharply-defined profiles, but rather have rounded profiles. The interior corners 81C are disposed a height $H_2$ from the top surfaces of the fins 66, which can be in the range of about 4 nm to about 38 nm.

Widening the recesses 100 to have funnel shapes can help avoid pinch-off effects when filling the recesses 100, thus avoiding the formation of seams. A ratio of the upper widths $W_3$ to the lower widths $W_2$ can be in the range of about 1.1 to about 11, and a ratio of the depth $D_2$ to the height $H_2$ can be in the range of about 1.2 to about 32. Widening the recesses 100 to have dimension ratios in these ranges helps form a funnel shape that is conducive to avoiding pinch-off effects during subsequent filling. Forming the recesses 100 to have dimension ratios outside of these ranges may not help form funnel shapes that are conducive to avoiding pinch-off effects during subsequent filling. For example, when the ratio of the upper widths $W_3$ to the lower widths $W_2$ is greater than the given range, parasitic capacitance between the resulting gate structures can be induced, such as due to excessive loss of dielectric material between the gate structures. Likewise, when the ratio of the upper widths $W_3$ to the lower widths $W_2$ is less than the given range, pinch-off effects can occur.

Figure 15D:
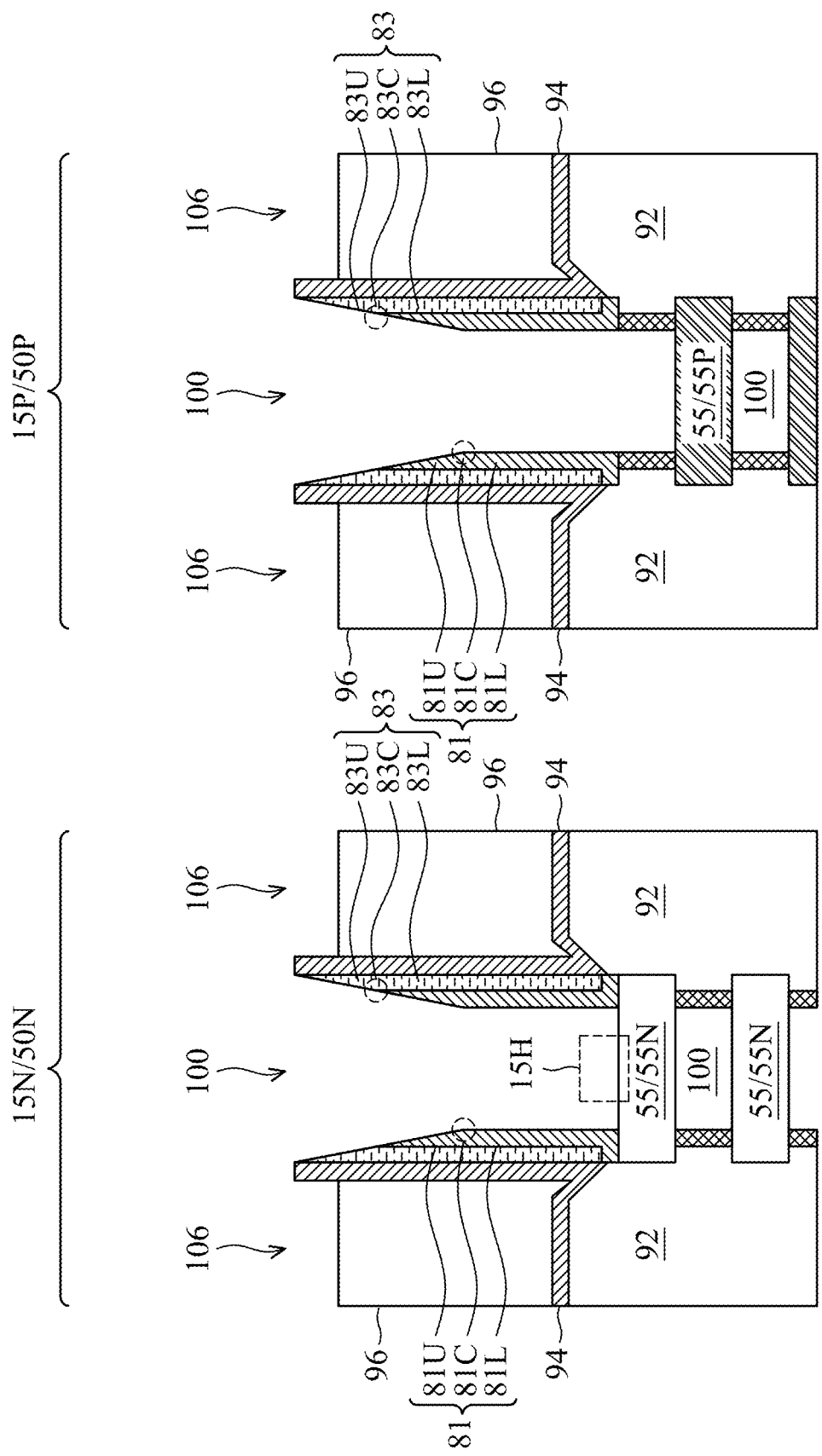

In FIG. 15D, the first semiconductor layers 52 in the n-type region 50N and the second semiconductor layers 54 in the p-type region 50P are removed to expand the recesses 100. Thus, the nano-structures 55N are formed in the n-type region 50N, and the nano-structures 55P are formed in the p-type region 50P.

The first semiconductor layers 52 in the n-type region 50N may be removed by masking the p-type region 50P and performing an etching process in the n-type region 50N. In some embodiments, the etching process is an isotropic etching process, such as a wet etch using etchants that selectively etch the first semiconductor layers 52 at a faster rate than the second semiconductor layers 54 or the substrate 50. In embodiments where the first semiconductor layers 52 are formed of silicon germanium, the first semiconductor layers 52 in the n-type region 50N can be removed by a wet etch process with tetramethylammonium hydroxide (TMAH), ammonium hydroxide (NH$_4$OH), or the like.

The second semiconductor layers 54 in the p-type region 50P may be removed by masking the n-type region 50N and performing an etching process in the p-type region 50P. In some embodiments, the etching process is an isotropic etching process, such as a wet etch using etchants that selectively etch the second semiconductor layers 54 at a faster rate than the first semiconductor layers 52 or the substrate 50. In embodiments where the second semiconductor layers 54 are formed of silicon or silicon carbide, the second semiconductor layers 54 in the p-type region 50P can be removed by a wet etch process with diluted ammonium hydroxide-hydrogen peroxide mixture (APM), sulfuric acid-hydrogen peroxide mixture (SPM), or the like.

Figure 15E:
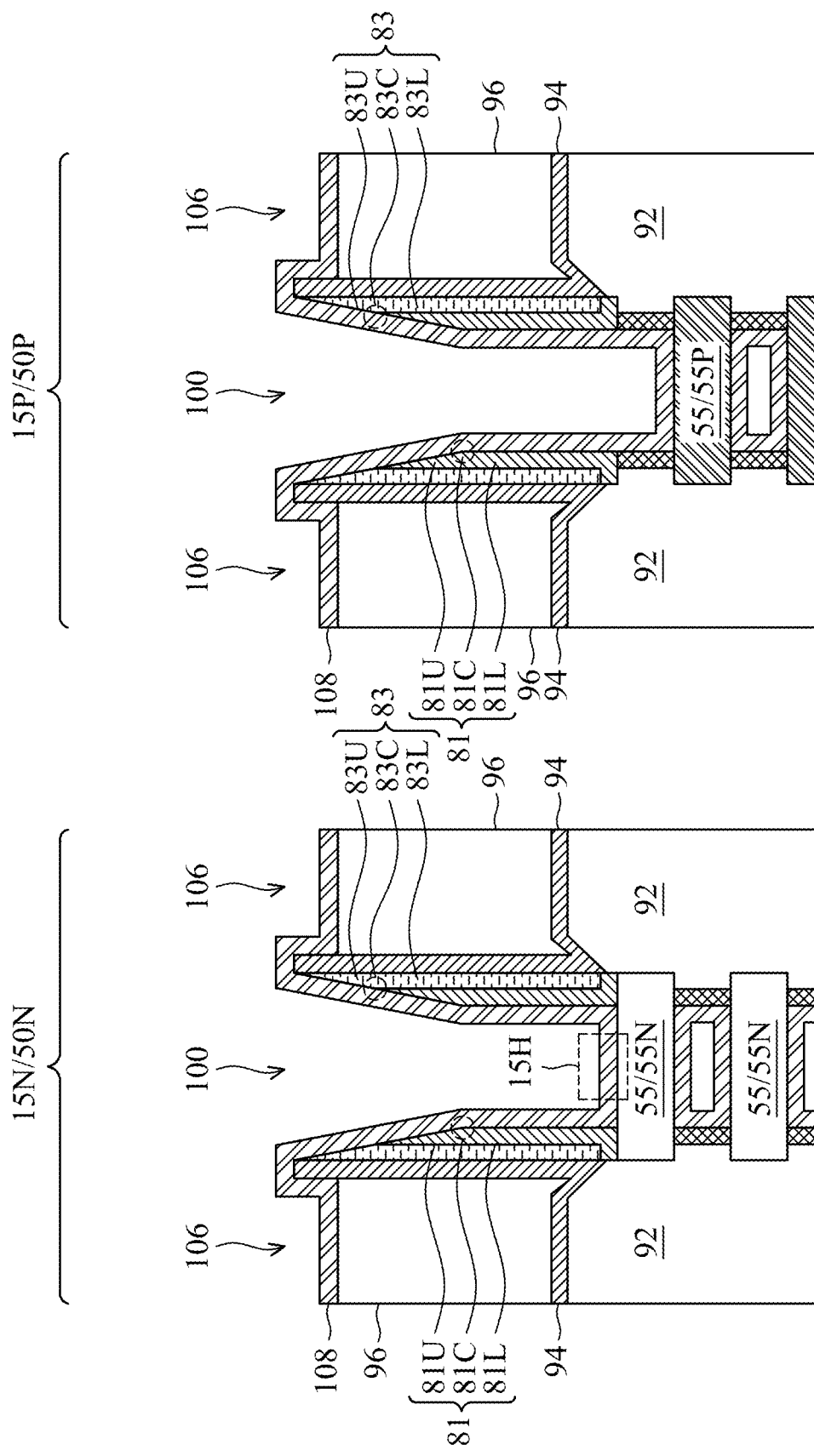

In FIG. 15E, a gate dielectric layer 108 is formed. The gate dielectric layer 108 is deposited conformally in the recesses 100, 106. In the n-type region 50N, the gate dielectric layer 108 is formed on top surfaces, sidewalls, and bottom surfaces of the nano-structures 55N. In the p-type region 50P, the gate dielectric layer 108 is formed on top surfaces, sidewalls, and bottom surfaces of the nano-structures 55P. The gate dielectric layer 108 is also deposited on top surfaces of the first ILD layer 96, the CESL 94, the first spacers 81, the second spacers 83, and the STI regions 68.

Figure 15F:
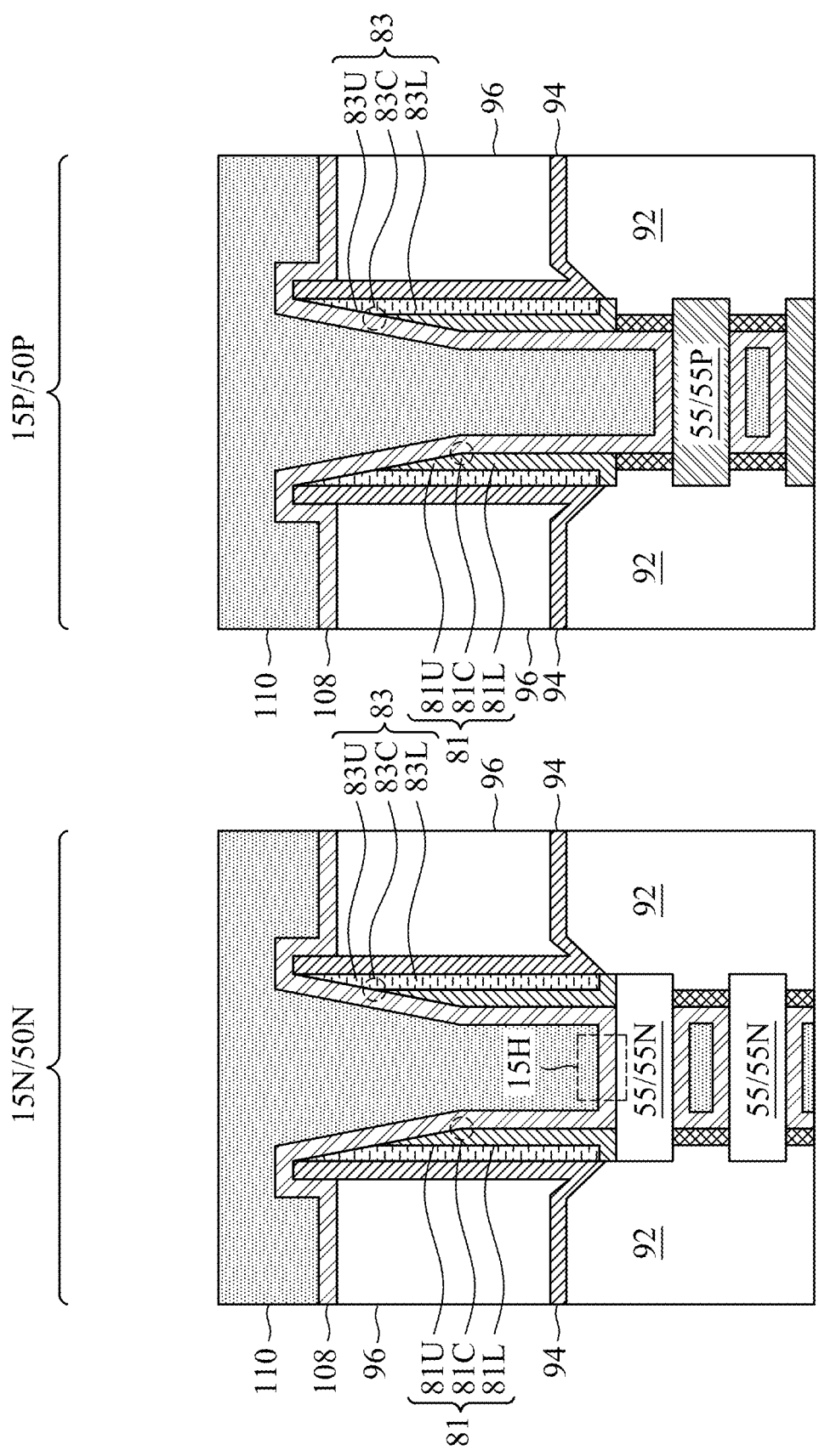
Figure 15G:
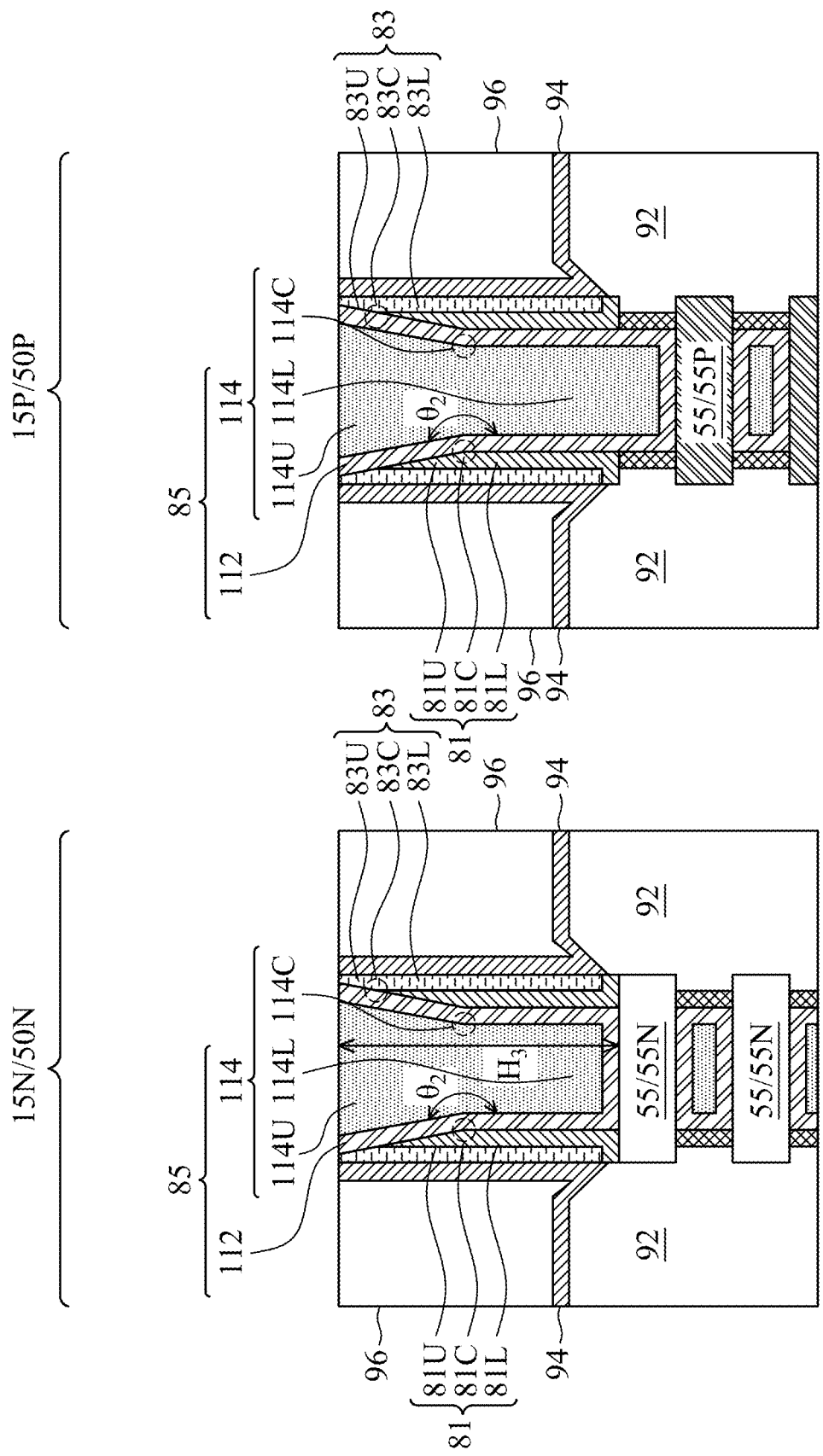
Figure 15H:
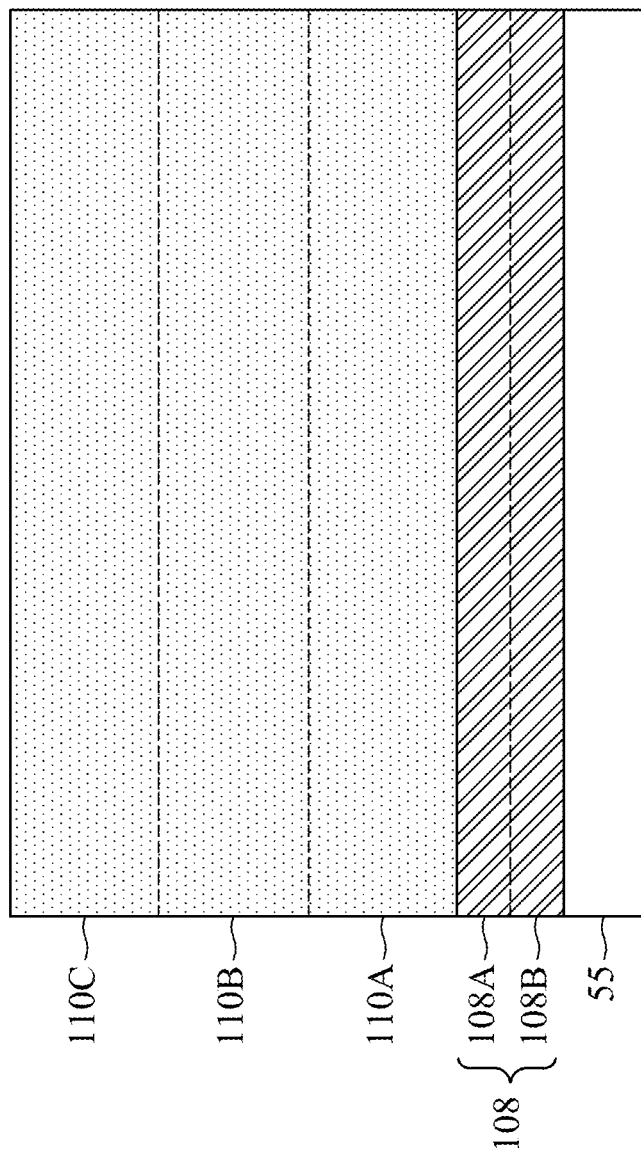

FIG. 15H is a detailed view of a region 15H in FIG. 15E, showing the gate dielectric layer 108 in more detail. The gate dielectric layer 108 includes one or more dielectric layers, such as an oxide, a metal oxide, a metal silicate, the like, or combinations thereof. For example, in some embodiments, the gate dielectric layer 108 may include an interfacial layer 108A of silicon oxide formed by thermal or chemical oxidation and a metal oxide layer 108B over the interfacial layer 108A. In some embodiments, the gate dielectric layer 108 includes a high-k dielectric material, and in these embodiments, the gate dielectric layer 108 may have a k value greater than about 7.0, and may include a metal oxide or a silicate of hafnium, aluminum, zirconium, lanthanum, manganese, barium, titanium, lead, and combinations thereof. The formation methods of the gate dielectric layer 108 may include molecular-beam deposition (MBD), ALD, PECVD, and the like. In some embodiments, the same gate dielectric layer 108 is deposited in the n-type region 50N and the p-type region 50P. In some embodiments, different gate dielectric layers 108 are deposited in the n-type region 50N and the p-type region 50P.

In FIG. 15F, a gate electrode layer 110 is deposited over the gate dielectric layer 108, filling the remaining portions of the recesses 100. FIG. 15H is a detailed view of a region 15H in FIG. 15F, showing the gate electrode layer 110 in more detail. The gate electrode layer 110 may include a metal-containing material such as titanium nitride, titanium oxide, tantalum nitride, tantalum carbide, cobalt, ruthenium, aluminum, tungsten, combinations thereof, or multi-layers thereof. For example, although a single gate electrode layer 110 is illustrated in FIG. 15F, the gate electrode layer 110 may include any number of liner layers 110A, any number of work function tuning layers 110B, and a fill material 110C, as shown by FIG. 15H. Any combination of the layers which make up the gate electrode layer 110 may be deposited in the n-type region 50N between adjacent ones of the nano-structures 55N, and may be deposited in the p-type region 50P between adjacent ones of the nano-structures 55P.

In FIG. 15G, a planarization process, such as a CMP, may be performed to remove the excess portions of the material of the gate dielectric layer 108 and the material of the gate electrode layer 110, which excess portions are outside of the recesses 100, e.g., over the top surface of the first ILD layer 96. The remaining portions of the gate dielectric layer 108 and the gate electrode layer 110 form the gate dielectrics 112 and the gate electrodes 114, respectively. The gate dielectrics 112 and the gate electrodes 114 form the gate structures 85 of the resulting nano-FETs. The gate structures 85 physically contact the remaining portions of the spacers 81, 83. After the planarization process, the gate structures 85 can have a height $H_3$, (measured from the top surfaces of the nano-structures 55) in the range of about 4 nm to about 30 nm. The final height $H_3$ of the gate structures 85 is less than the depth $D_2$ of the recesses 100 (see FIG. 15C) by nature of the planarization process. As discussed further below, the gate structures 85 have funnel shapes. In some embodiments, the ratio of the upper widths of the gate structures 85 to the lower widths of the gate structures 85 can be in the range of about 1.1 to about 11.

In some embodiments, the upper portions 81U, 83U of the spacers 81, 83 remain after the planarization process. The gate electrodes 114 thus have upper portions 114U and lower portions 114L, which together form funnel shapes. The widths of the upper portions 114U increase continually in a direction extending away from the top surfaces of the nano-structures 55. The widths of the lower portions 114L are constant along the direction extending away from the top surfaces of the nano-structures 55. The widths of the gate dielectrics 112 are constant along the sidewalls of the gate electrodes 114. The gate electrodes 114 have interior corners 114C at the interfaces of the upper portions 114U and lower portions 114L. Sidewalls of the gate electrodes 114 form an interior angle $\theta_2$ at the interior corners 114C of the gate electrodes 114, with the difference between the interior angle $\theta_2$ and the interior angle $\theta_1$ (see FIG. 15C) being equal to 180 degrees. In other words, the interior angle $\theta_2$ can be in the range of about 183 degrees to about 230 degrees. In the illustrated embodiment, the interior corners 114C have sharply-defined profiles. In some embodiments (discussed further below), the interior corners 114C do not have sharply-defined profiles, but rather have rounded profiles.

The formation of the gate dielectrics 112 in the n-type region 50N and the p-type region 50P may occur simultaneously such that the gate dielectrics 112 in each region are formed from the same materials, and the formation of the gate electrodes 114 may occur simultaneously such that the gate electrodes 114 in each region are formed from the same materials. In some embodiments, the gate dielectrics 112 in each region may be formed by distinct processes, such that the gate dielectrics 112 may be different materials and/or have a different number of layers, and/or the gate electrodes 114 in each region may be formed by distinct processes, such that the gate electrodes 114 may be different materials and/or have a different number of layers. Various masking steps may be used to mask and expose appropriate regions when using distinct processes.

The embodiments described with respect to FIGS. 15A through 15G are discussed in the context of a plasma oxidation process or a plasma nitridation process. However, it should be appreciated that any impurity may be implanted (see FIG. 15B) in the spacers 81, 83 to modify an etch rate of portions of the spacers 81, 83. Any etch (see FIG. 15C) that is selective to the implanted impurity may be then performed to remove the modified portions of the spacers 81, 83 and widen the recesses 100.

Figure 16A:
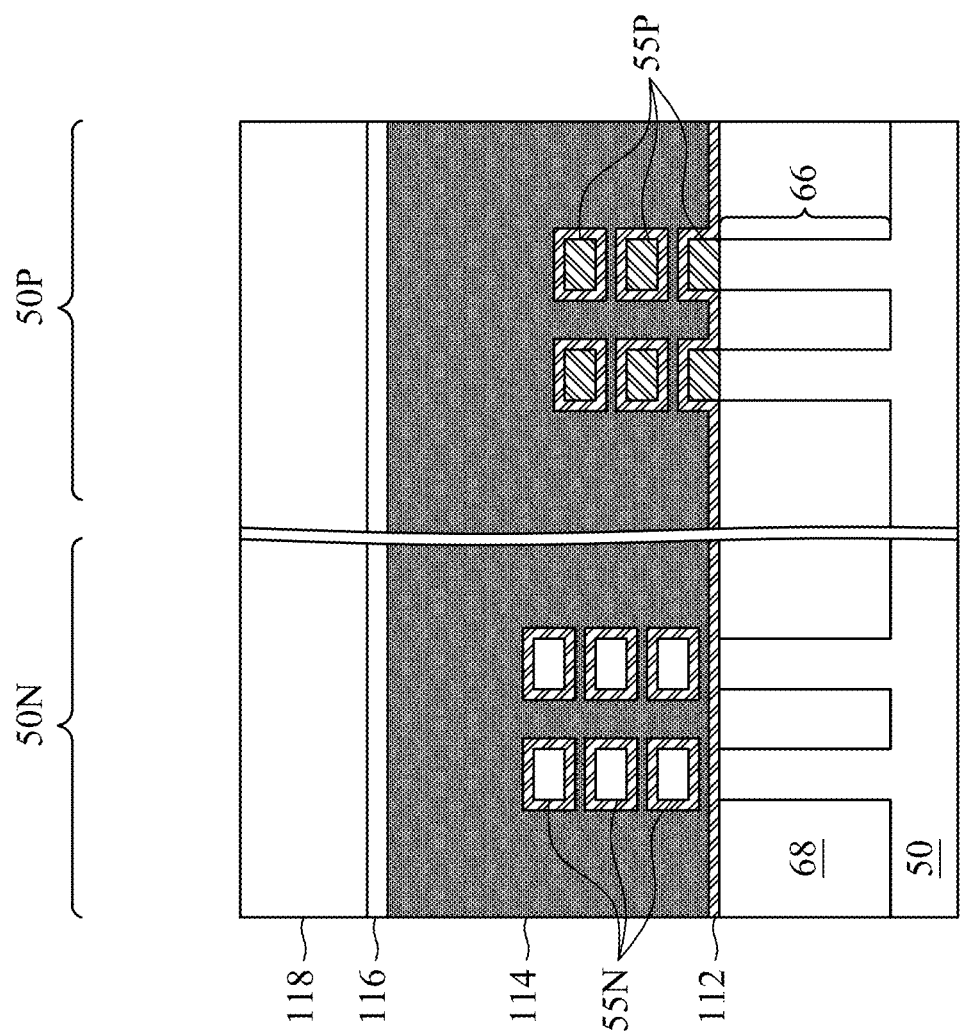
Figure 16B:
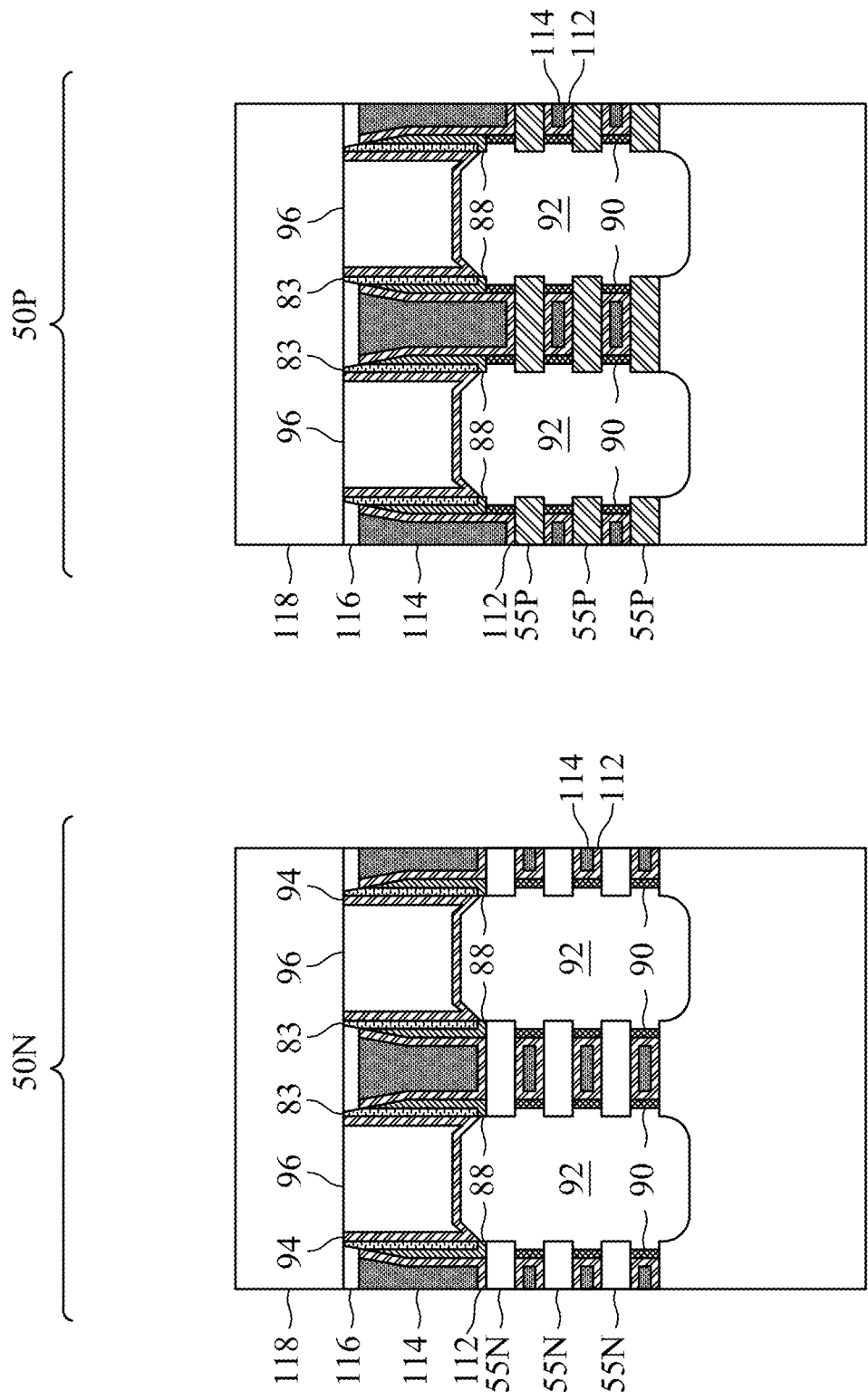

In FIGS. 16A and 16B, a second ILD layer 118 is deposited over the first ILD layer 96. The second ILD layer 118 may be formed of a dielectric material, and may be deposited by any suitable method, such as CVD, plasma-enhanced CVD (PECVD), or FCVD. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. After formation, the second ILD layer 118 can be planarized, such as by a CMP. In some embodiments, an etch stop layer is formed between the first ILD layer 96 and the second ILD layer 118. The etch stop layer may include a dielectric material, such as silicon nitride, silicon oxide, silicon oxynitride, or the like, having a different etch rate than the material of the second ILD layer 118.

In some embodiments, before the formation of the second ILD layer 118, gate masks 116 can be formed over the gate dielectrics 112 and gate electrodes 114. The gate masks 116 can protect the gate dielectrics 112 and gate electrodes 114 during subsequent contact formation, and subsequently formed gate contacts can penetrate through the gate masks 116. As an example to form the gate masks 116, the gate dielectrics 112 and the gate electrodes 114 may be recessed, so that recesses are formed directly between opposing portions of the second spacers 83. One or more layers of dielectric material, such as silicon nitride, silicon oxynitride, or the like, are filled in the recesses. A planarization process is performed to remove excess portions of the dielectric material extending over the first ILD layer 96. The remaining portions of the dielectric material in the recesses forms the gate masks 116.

In FIGS. 17A and 17B, gate contacts 120 are formed extending through the second ILD layer 118 and the gate masks 116 (if present), and source/drain contacts 122 are formed extending through the second ILD layer 118, the first ILD layer 96, and the CESL 94. Openings for the gate contacts 120 are formed through the second ILD layer 118 and the gate masks 116, and openings for the source/drain contacts 122 are formed through the second ILD layer 118, the first ILD layer 96, and the CESL 94. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 118. The remaining liner and conductive material form the gate contacts 120 and the source/drain contacts 122 in the openings. The gate contacts 120 are connected (e.g., physically and electrically coupled) to the gate electrodes 114, and the source/drain contacts 122 are connected to the epitaxial source/drain regions 92. The gate contacts 120 and the source/drain contacts 122 may be formed in different processes, or may be formed in the same process. Although the gate contacts 120 and the source/drain contacts 122 are illustrated in the same cross-section, the contacts may be formed in different cross-sections, which may avoid shorting of the contacts.

In some embodiments, silicide regions are formed between the epitaxial source/drain regions 92 and the source/drain contacts 122. In some embodiments, the silicide regions are formed by depositing a metal in the openings for the source/drain contacts 122 (e.g., on the epitaxial source/drain regions 92) and then performing a thermal anneal process. The metal can be one that is capable of reacting with the semiconductor materials of the epitaxial source/drain regions 92 (e.g., silicon, silicon germanium, germanium, etc.) to form silicide regions, such as nickel, cobalt, titanium, tantalum, platinum, tungsten, other noble metals, other refractory metals, rare earth metals or their alloys, or the like. After the thermal anneal process, any unreacted portions of the deposited metal can then be removed, e.g., by an etching process. Although they are referred to as silicide regions, the regions formed on the epitaxial source/drain regions 92 may also be germanide regions, silicon germanide regions (e.g., regions including silicide and germanide), or the like.

Figure 18:
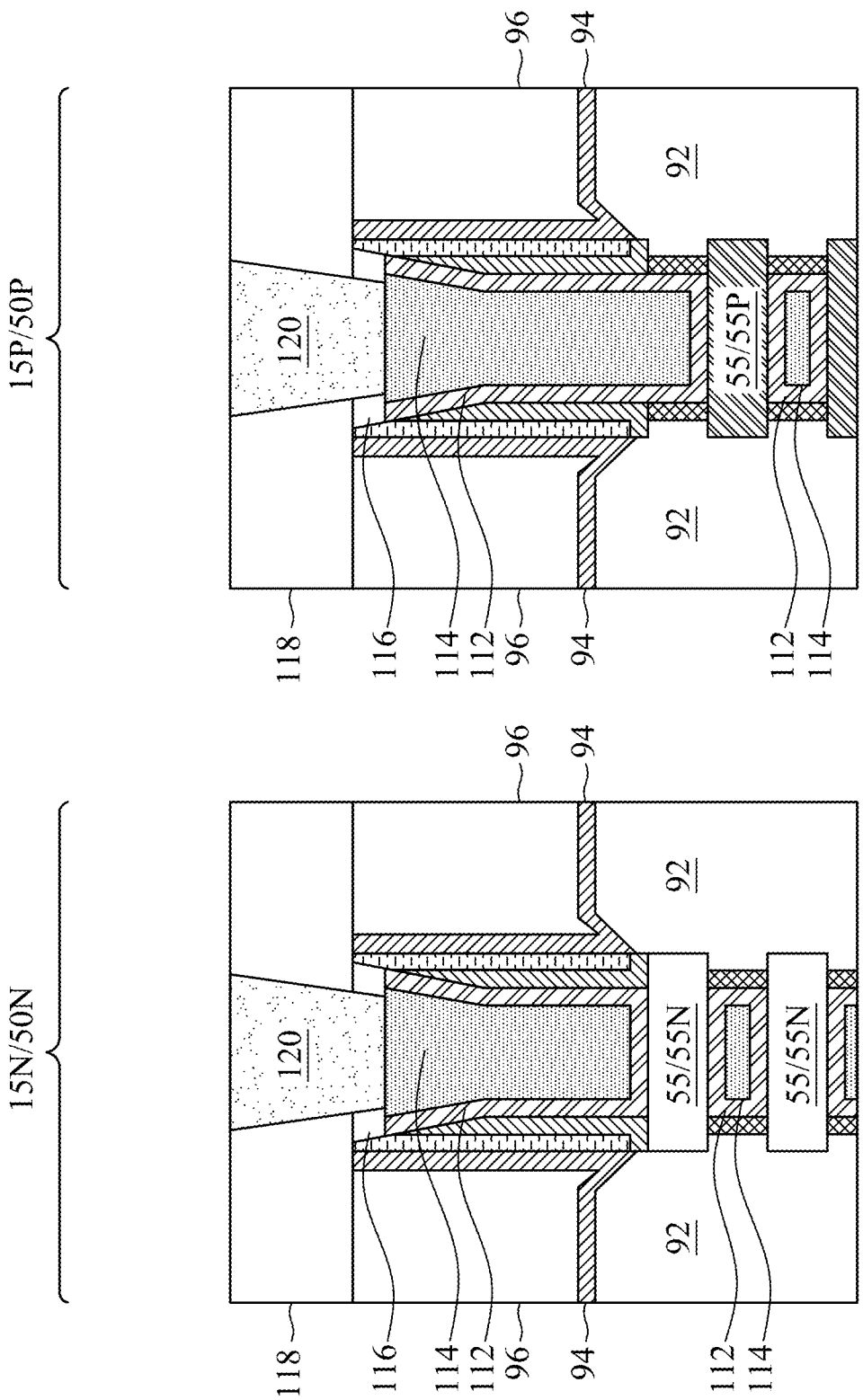
FIG. 18 illustrates nano-FETs, in accordance with some embodiments

FIG. 18 shows cross-sectional views of nano-FETs, in accordance with some embodiments. An n-type region 15N in FIG. 17B, which is part of the n-type region 50N, and a p-type region 15P in FIG. 17B, which is part of the p-type region 50P, are illustrated in more detail. As shown, the gate masks 116 can have slanted sidewalls.

Embodiments may achieve advantages. Performing an impurity implantation allows first regions of the spacers 81, 83 (e.g., the regions 81M, 83M) to be modified more than second regions of the spacers 81, 83 (e.g., the regions 81N, 83N). An etch selective to the impurity may thus be performed to remove the first regions of the spacers 81, 83 (e.g., the regions 81M, 83M) without substantially etching the second regions of the spacers 81, 83 (e.g., the regions 81N, 83N). As such, the recesses 100 have upper portions that continually increase in width in a direction extending away from the fins 66. Forming the recesses 100 with such a shape can help avoid pinch-off effects when filling the recesses 100 with the gate electrode layer no. The gap filling window for the gate electrode layer no may thus be improved. Improving the gap filling window for the gate electrode layer no can avoid or reduce the formation of seams (or voids) in the gate electrodes 114. The work function and internal gate resistance ($R_g$) of the gate electrodes 114 may thus be improved, thereby increasing the performance and yield of the resulting nano-FETs.

In an embodiment, a method includes: forming a dummy dielectric over a plurality of semiconductor layers; forming a dummy gate over the dummy dielectric; depositing a gate spacer adjacent the dummy gate and the dummy dielectric; recessing the dummy gate to form a recess exposing the gate spacer; implanting an impurity in a first region of the gate spacer to increase an etch rate of the first region of the gate spacer, a second region of the gate spacer remaining unmodified by the implanting; removing the dummy dielectric, the first region of the gate spacer, and remaining portions of the dummy gate to expose the semiconductor layers in the recess; patterning the semiconductor layers to form nano-structures; and forming a gate structure in the recess, the gate structure wrapped around the nano-structures, the gate structure contacting the second region of the gate spacer. In some embodiments of the method, implanting the impurity in the first region of the gate spacer includes: flowing a gas source including an impurity source precursor gas and a carrier gas over the semiconductor layers; generating a plasma from the gas source, the plasma including impurity ions and impurity radicals; and accelerating the impurity ions in the plasma towards the gate spacer in a non-directional manner. In some embodiments of the method, the impurity is oxygen, and the impurity source precursor gas includes oxygen gas. In some embodiments of the method, the impurity is nitrogen, and the impurity source precursor gas includes nitrogen gas. In some embodiments of the method, the plasma is generated at a temperature in a range of 20° C. to 650° C., at a pressure in a range of 5 mTorr to 500 mTorr, and at a radio frequency (RF) power in a range of 30 to 4000 watts, and accelerating the impurity ions includes applying a direct current (DC) bias having a low voltage of zero and a high voltage of up to 100 V. In some embodiments of the method, the plasma is generated at a temperature in a range of 20° C. to 650° C., at a pressure in a range of 5 mTorr to 500 mTorr, and at a radio frequency (RF) power in a range of 30 watts to 4000 watts, and accelerating the impurity ions includes applying a RF bias having a low power of zero and a high power of up to 100 watts. In some embodiments of the method, the plasma has a plasma density in a range of $10^9$ cm$^{-3}$ to $10^{12}$ cm$^{-3}$. In some embodiments of the method, removing the dummy dielectric and the first region of the gate spacer includes: performing an anisotropic dry etch in the recess, the anisotropic dry etch etching the dummy dielectric and the first region of the gate spacer at a greater rate than the second region of the gate spacer. In some embodiments of the method, the impurity is oxygen, the gate spacer includes silicon oxycarbonitride, the anisotropic dry etch is performed with nitrogen trifluoride, ammonia, or hydrogen fluoride, and the anisotropic dry etch converts the first region of the gate spacer to ammonium fluorosilicate, silicon tetrafluoride, or water byproducts. In some embodiments of the method, the impurity is nitrogen, the gate spacer includes silicon oxycarbonitride, the anisotropic dry etch is performed with nitrogen trifluoride, ammonia, or hydrogen fluoride, and the anisotropic dry etch converts the first region of the gate spacer to ammonium fluorosilicate or silicon tetrafluoride byproducts. In some embodiments of the method, after removing the dummy dielectric, the first region of the gate spacer, and the remaining portions of the dummy gate, the recess has an upper width and a lower width, the upper width being greater than the lower width, a ratio of the upper width to the lower width being in a range of 1.1 to 11. In some embodiments of the method, recessing the dummy gate includes performing a first anisotropic dry etch process with methane at a first bias, and removing the remaining portions of the dummy gate includes performing a second anisotropic dry etch process with methane at a second bias, the second bias being different from the first bias.

In an embodiment, a structure includes: a nano-structure; an epitaxial source/drain region adjacent the nano-structure; a gate dielectric wrapped around the nano-structure; a gate electrode over the gate dielectric, the gate electrode having an upper portion and a lower portion, a first width of the upper portion increasing continually in a first direction extending away from a top surface of the nano-structure, a second width of the lower portion being constant along the first direction; and a gate spacer between the gate dielectric and the epitaxial source/drain region. In some embodiments of the structure, the gate electrode includes an interior corner at interfaces of the upper portion and the lower portion, sidewalls of the gate electrode forming an angle at the interior corner, the angle being in a range of 183 degrees to 230 degrees. In some embodiments of the structure, the gate spacer has an upper portion and a lower portion, a third width of the upper portion decreasing continually in the first direction, a fourth width of the lower portion being constant along the first direction. In some embodiments, the structure further includes: a gate mask over the gate electrode and the gate dielectric, the gate mask having slanted sidewalls; and a gate contact extending through the gate mask to contact the gate electrode. In some embodiments of the structure, the gate spacer includes silicon oxycarbonitride having a first concentration of oxygen in an upper portion of the gate spacer and a second concentration of oxygen in a lower portion of the gate spacer, the second concentration being less than the first concentration. In some embodiments of the structure, the gate spacer includes silicon oxycarbonitride having a first concentration of nitrogen in an upper portion of the gate spacer and a second concentration of nitrogen in a lower portion of the gate spacer, the second concentration being less than the first concentration.

In an embodiment, a structure includes: a nano-structure; a gate structure wrapped around the nano-structure; and a first pair of gate spacers adjacent the gate structure, the first pair of gate spacers being separated by a first distance at a lower portion of the gate structure, the first pair of gate spacers being separated by a second distance at an upper portion of the gate structure, the second distance being greater than the first distance.

In some embodiments of the structure, a ratio of the second distance to the first distance is in a range of 1.1 to 11.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a dummy dielectric over a plurality of semiconductor layers;
    forming a dummy gate over the dummy dielectric;
    depositing a gate spacer adjacent the dummy gate and the dummy dielectric;
    recessing the dummy gate to form a recess exposing the gate spacer;
    implanting an impurity in a first region of the gate spacer to increase an etch rate of the first region of the gate spacer, a second region of the gate spacer remaining unmodified by the implanting, the impurity being implanted in a non-directional manner;
    removing the dummy dielectric, the first region of the gate spacer, and remaining portions of the dummy gate to expose the semiconductor layers in the recess;
    patterning the semiconductor layers to form nano-structures; and
    forming a gate structure in the recess, the gate structure wrapped around the nano-structures, the gate structure contacting the second region of the gate spacer.

2. The method of claim 1, wherein implanting the impurity in the first region of the gate spacer comprises:
    flowing a gas source comprising an impurity source precursor gas and a carrier gas over the semiconductor layers;
    generating a plasma from the gas source, the plasma comprising impurity ions and impurity radicals; and
    accelerating the impurity ions in the plasma towards the gate spacer in a non-directional manner.

3. The method of claim 2, wherein the impurity is oxygen, and the impurity source precursor gas comprises oxygen gas.

4. The method of claim 2, wherein the impurity is nitrogen, and the impurity source precursor gas comprises nitrogen gas.

5. The method of claim 2, wherein the plasma is generated at a temperature in a range of 20° C. to 650° C., at a pressure in a range of 5 mTorr to 500 mTorr, and at a radio frequency (RF) power in a range of 30 to 4000 watts, and wherein accelerating the impurity ions comprises applying a direct current (DC) bias having a low voltage of zero and a high voltage of up to 100 V.

6. The method of claim 2, wherein the plasma is generated at a temperature in a range of 20° C. to 650° C., at a pressure in a range of 5 mTorr to 500 mTorr, and at a radio frequency (RF) power in a range of 30 watts to 4000 watts, and wherein accelerating the impurity ions comprises applying a RF bias having a low power of zero and a high power of up to 100 watts.

7. The method of claim 2, wherein the plasma has a plasma density in a range of $10^9$ cm$^{-3}$ to $10^{12}$ cm$^{-3}$.

8. The method of claim 1, wherein removing the dummy dielectric and the first region of the gate spacer comprises:
    performing an anisotropic dry etch in the recess, the anisotropic dry etch etching the dummy dielectric and the first region of the gate spacer at a greater rate than the second region of the gate spacer.

9. The method of claim 8, wherein the impurity is oxygen, the gate spacer comprises silicon oxycarbonitride, the anisotropic dry etch is performed with nitrogen trifluoride, ammonia, or hydrogen fluoride, and the anisotropic dry etch converts the first region of the gate spacer to ammonium fluorosilicate, silicon tetrafluoride, or water byproducts.

10. The method of claim 8, wherein the impurity is nitrogen, the gate spacer comprises silicon oxycarbonitride, the anisotropic dry etch is performed with nitrogen trifluoride, ammonia, or hydrogen fluoride, and the anisotropic dry etch converts the first region of the gate spacer to ammonium fluorosilicate or silicon tetrafluoride byproducts.

11. The method of claim 1, wherein after removing the dummy dielectric, the first region of the gate spacer, and the remaining portions of the dummy gate, the recess has an upper width and a lower width, the upper width being greater than the lower width, a ratio of the upper width to the lower width being in a range of 1.1 to 11.

12. The method of claim 1, wherein recessing the dummy gate comprises performing a first anisotropic dry etch process with methane at a first bias, and wherein removing the remaining portions of the dummy gate comprises performing a second anisotropic dry etch process with methane at a second bias, the second bias being different from the first bias.

13. A method comprising:
    forming a gate spacer on a sidewall of a dummy gate, the dummy gate disposed on a channel region of a substrate;
    increasing an etch rate of an upper region of the gate spacer relative a first etching process by non-directionally implanting an impurity in the gate spacer, more of the impurity being implanted in the upper region of the gate spacer than in a lower region of the gate spacer;
    removing the upper region of the gate spacer by etching the upper region of the gate spacer with the first etching process;
    exposing the channel region by removing dummy gate; and
    forming a gate structure on the channel region of the substrate.

14. The method of claim 13, wherein non-directionally implanting the impurity in the gate spacer comprises oxidizing the gate spacer.

15. The method of claim 13, wherein non-directionally implanting the impurity in the gate spacer comprises nitrating the gate spacer.

16. The method of claim 13, wherein a portion of the dummy gate is removed by etching the dummy gate with the first etching process.

17. The method of claim 13, wherein a portion of the dummy gate is removed by etching the dummy gate with a second etching process, the second etching process being different from the first etching process.

18. A method comprising:
forming a gate spacer on a sidewall of a dummy gate, the dummy gate disposed on a channel region of a substrate;
recessing the dummy gate to expose an upper region of the gate spacer, a lower region of the gate spacer remaining covered by the dummy gate, wherein recessing the dummy gate comprises performing a first etch process with a first etchant at a first bias;
implanting an impurity in the gate spacer to modify the gate spacer, the lower region of the gate spacer being less modified by the implanting than the upper region of the gate spacer;
removing the upper region of the gate spacer and remaining portions of the dummy gate to expose the channel region, wherein removing the remaining portions of the dummy gate comprises performing a second etch process with the first etchant at a second bias, the second bias being different from the first bias; and
forming a gate structure on the channel region.

19. The method of claim 18, wherein the lower region of the gate spacer is unmodified by the implanting the impurity in the gate spacer.

20. The method of claim 18, wherein the lower region of the gate spacer is modified by the implanting the impurity in the gate spacer.

* * * * *